(12) United States Patent
Kim et al.

(10) Patent No.: US 7,858,527 B2
(45) Date of Patent: Dec. 28, 2010

(54) ADDITIVE COMPOSITION, SLURRY COMPOSITION INCLUDING THE SAME, AND METHOD OF POLISHING AN OBJECT USING THE SLURRY COMPOSITION

(75) Inventors: Nam-Soo Kim, Suwon-si (KR); Sang-Mun Chon, Seongnam-si (KR); Young-Sam Lim, Seoul (KR); Kyoung-Moon Kang, Busan-si (KR); Sei-Cheol Lee, Seoul (KR); Jae-Hyun So, Seoul (KR); Dong-Jun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 616 days.

(21) Appl. No.: 11/861,490

(22) Filed: Sep. 26, 2007

(65) Prior Publication Data

US 2008/0014838 A1    Jan. 17, 2008

Related U.S. Application Data

(62) Division of application No. 10/293,918, filed on Nov. 14, 2002, now Pat. No. 7,288,212.

(30) Foreign Application Priority Data

Nov. 15, 2001  (KR) .................. 2001-71152
Apr. 26, 2002  (KR) .................. 2002-23087

(51) Int. Cl.
*H01L 21/302* (2006.01)
*H01L 21/461* (2006.01)

(52) U.S. Cl. .............. 438/690; 438/691; 438/692; 438/693; 252/79.1; 252/79.4

(58) Field of Classification Search .............. None
See application file for complete search history.

(56) References Cited

U.S. PATENT DOCUMENTS

| 4,711,919 | A |   | 12/1987 | Peppmoller et al. |
| 4,773,967 | A |   | 9/1988  | Peppmoller et al. |
| 5,938,505 | A |   | 8/1999  | Morrison et al. |
| 5,958,794 | A | * | 9/1999  | Bruxvoort et al. ........... 438/692 |
| 6,114,249 | A |   | 9/2000  | Canaperi et al. |
| 6,435,944 | B1| * | 8/2002  | Wang et al. .................. 451/41 |
| 6,602,436 | B2|   | 8/2003  | Mandigo et al. |
| 6,726,534 | B1| * | 4/2004  | Bogush et al. ............... 451/36 |

FOREIGN PATENT DOCUMENTS

EP         0152087 A2      2/1985

(Continued)

*Primary Examiner*—Duy-Vu N Deo
(74) *Attorney, Agent, or Firm*—Volentine & Whitt, PLLC

(57) ABSTRACT

An additive composition for a slurry contains a first salt of polymeric acid including a first polymeric acid having a first weight average molecular weight and a first base material, and a second salt of polymeric acid including a second polymeric acid having a second weight average molecular weight and a second base material. A slurry composition is prepared by mixing the additive composition, a polishing particle composition, and water. When implementing a chemical mechanical polishing using the slurry composition, a favorable polishing selectivity is realized.

14 Claims, 18 Drawing Sheets

FOREIGN PATENT DOCUMENTS

| | | |
|---|---|---|
| EP | 11148538 A1 | 10/2001 |
| EP | 0879852 A1 | 9/2007 |
| GB | 2256644 A | 12/1992 |
| JP | 10-106988 | 4/1998 |
| JP | 10-154672 | 6/1998 |
| JP | 10-270401 | 10/1998 |
| JP | 2001-31951 | 2/2001 |
| JP | 2001-35820 | 2/2001 |
| JP | 2001-319900 | 11/2006 |
| KR | 2001-0108048 | 12/2001 |
| WO | 01/14496 A1 | 3/2001 |

* cited by examiner

ADDITIVE COMPOSITION, SLURRY COMPOSITION INCLUDING THE SAME, AND METHOD OF POLISHING AN OBJECT USING THE SLURRY COMPOSITION

CROSS-REFERENCE TO RELATED APPLICATION(S)

This is a Divisional of application Ser. No. 10/293,918, filed Nov. 14, 2002, which is now U.S. Pat. No. 7,288,212, issued Oct. 30, 2007, and which is incorporated herein by references in its entirety.

BACKGROUND OF THE INVENTION

1. Field of the Invention

The present invention relates to an additive composition, a slurry composition including the additive composition, and a method of polishing an object using the slurry composition. More particularly, the present invention relates to an additive composition including a salt of a polymer acid, a slurry composition including the additive composition, and chemical mechanical polishing of an object using the slurry composition.

2. Description of the Related Art

As information media such as computers have seen widespread use, semiconductor device technologies have rapidly progressed. From a functional aspect, semiconductor devices should exhibit rapid operating speeds, large capacities, and high degrees of integration. To this end, manufacturing techniques have been developed to improve device performance and characteristics.

One such technique is chemical mechanical polishing (CMP), which was been developed in the 1980s. In CMP, a surface portion of a layer formed on a substrate is planarized through polishing. This technique is used, for example, when fabricating an shallow trench isolation (STI) structure.

U.S. Pat. No. 6,165,052 issued to Yu et al. discloses a method of fabricating an STI structure by applying CMP techniques.

FIGS. 1A-1E are sectional views for explaining a method of manufacturing an STI structure using the conventional polishing method.

Referring to FIG. 1A, a trench 12 is formed at the upper portion of a substrate 10 that is comprised of silicon. The trench 12 is formed via a photolithography process by using photoresist patterns as an etching mask.

Referring to FIG. 1B, a polish stop layer 14 is formed on the trench 12 and the substrate 10. Usually, the polish stop layer 14 is a silicon nitride layer that is comprised of a silicon nitride material. The polish stop layer 14 is formed by a chemical vapor deposition method.

Referring to FIG. 1C, a silicon oxide layer 16 is formed of silicon oxide material on the polish stop layer 14 so as to fill and bury the trench 12.

Referring to FIG. 1D, the silicon oxide layer 16 is polished to expose the polish stop layer 14a formed under the silicon oxide layer 16 and on the substrate 10, but not on the trench 12. Accordingly, silicon oxide material 16a remains only in the recessed portion of the trench 12.

Referring to FIG. 1E, the exposed polish stopping layer 14a is etched to expose the surface portion of the substrate 10. As the result, an STI structure 16b is formed on the substrate 10.

In CMP, an over-polishing technique is adopted for polishing a portion of the silicon nitride layer. The over-polishing utilizes the difference in polishing rates (i.e., removal rates) between the silicon oxide layer and the silicon nitride layer. The polishing rate of the silicon oxide layer is controlled to be faster than that of the silicon nitride layer. Through over-polishing, the silicon oxide layer formed on the silicon nitride layer can be completely polished.

The difference in the polishing rate between the two layers is controlled by a slurry composition used during polishing. Generally, an oxide based slurry composition including silica as polishing particles is used for the over-polishing. When this slurry composition is used for the over-polishing process, the polishing rate of the silicon oxide layer is 4-5 faster times than that of the silicon nitride layer.

FIG. 2 is a sectional view for explaining a dishing phenomenon generated during manufacturing of an STI structure by the conventional polishing method. This state is obtained after completing the over-polishing using the oxide based slurry composition. The silicon nitride layer 22 on the substrate 20 is exposed and the silicon oxide layer 24 remains only within the recessed portion of the trench.

However, after completing the over-polishing, a dishing feature is generated around the mouth portion of the trench A. This dishing phenomenon occurs when the silicon oxide layer filled within the mouth portion of the trench A is polished. In addition, erosion occurs between the neighboring trench portions B through an over-polishing of the silicon nitride layer formed at the portion between the trench portions B. In particular, at the regions where the trench patterns are formed minutely, more severe dishing and erosion features are generated.

Dishing and erosion is generated from low polishing selectivity, which is the ratio of the polishing rate of the silicon oxide layer to the polishing rate of the silicon nitride layer. The resultant non-planar surface features are factors which can result in defects when implementing subsequent processes.

To overcome low polishing selectivity, it has been suggested to form a relatively thick silicon nitride layer to minimize dishing and erosion. However, this technique is not appropriate for the manufacture of more recently developed semiconductor devices having multi-layer structures.

As a result, slurry compositions which result in even faster polishing rates of the silicon oxide layer relative to that of the silicon nitride layer have been developed. These kinds of slurry compositions are disclosed in U.S. Pat. No. 5,614,444 issued to Farkas et al., Japanese Laid-Open Patent Publication Nos. Hei 1998-106988, Hei 1998-154672, Hei 1998-270401, Hei 2001-31951, Hei 2001-35820 and Hei 2001-319900 and Korean Laid-Open Patent Publication No. 2001-108048.

Particularly, U.S. Pat. No. 6,114,249 issued to Canaperi et al. discloses a slurry composition having a silicon oxide layer polishing rate which is about 28 times faster than that of a silicon nitride layer.

U.S. Pat. No. 5,938,505 issued to Morrison et al. also discloses a slurry composition in which a polishing rate of a silicon oxide layer can be controlled to about 30 times faster than that of a silicon nitride layer.

Korean Laid-Open Patent Publication No. 2001-108048 discloses a slurry composition including a cerium oxide slurry, a dispersing agent as an additive and water in order to control a polishing rate of a silicon oxide layer to about 50 times faster than that of a silicon nitride layer.

As described above, various methods concerning the development of the slurry composition have been reported to improve a polishing selectivity. However, for the manufacture of the more recent semiconductor devices requiring a design rule of 0.13 µm or less, a slurry composition exhibiting an even higher polishing selectivity is required.

SUMMARY OF THE INVENTION

According to one aspect of the present invention, an additive composition for a slurry is provided which includes a first salt of polymeric acid and a second salt of polymeric acid. The first salt of polymeric acid includes a first polymeric acid having a first weight average molecular weight and a first base material. The second salt of polymeric acid includes a second polymeric acid having a second weight average molecular weight and a second base material.

According to another aspect of the present invention, a slurry composition is provided with includes an additive composition including a first salt and a second salt of polymeric acid, a polishing particle composition and water. The first salt of polymeric acid includes a first polymeric acid having a first weight average molecular weight and a first base material, and the second salt of polymeric acid includes a second polymeric acid having a second weight average molecular weight and a second base material.

According to yet another aspect of the present invention a method of polishing is provided which includes first preparing a slurry composition including an additive composition. The additive composition includes a first and a second salt of polymeric acid. The first salt of polymeric acid includes a first polymeric acid having a first weight average molecular weight and a first base material, and the second salt of polymeric acid includes a second polymeric acid having a second weight average molecular weight and a second base material. Then, the prepared slurry composition is provided onto a surface portion of a polishing pad. After that, a surface of a material to be processed is polished through contacting the surface of the material to be processed with the surface portion of the polishing pad.

BRIEF DESCRIPTION OF THE DRAWINGS

The features and advantages of the present invention will become readily apparent from the detailed description that follows, with reference to the accompanying drawings, in which.

DETAILED DESCRIPTION OF THE PREFERRED EMBODIMENTS

Figure 1A:
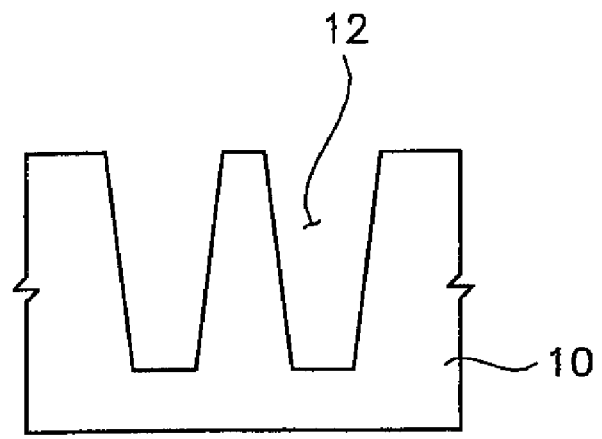
FIGS. 1A-1E are sectional views for explaining a manufacturing method of an STI structure by using a conventional polishing method.
Figure 1B:
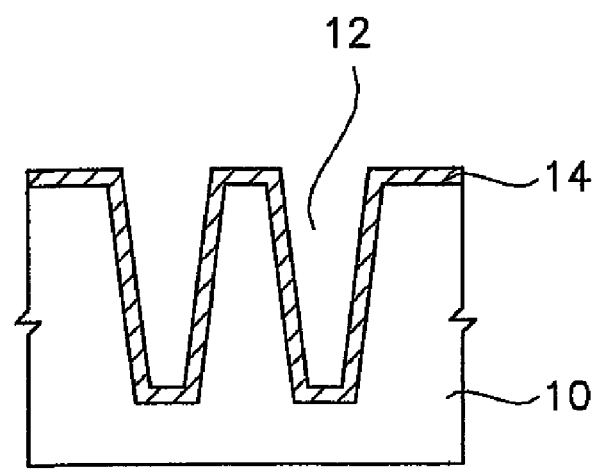
Figure 1C:
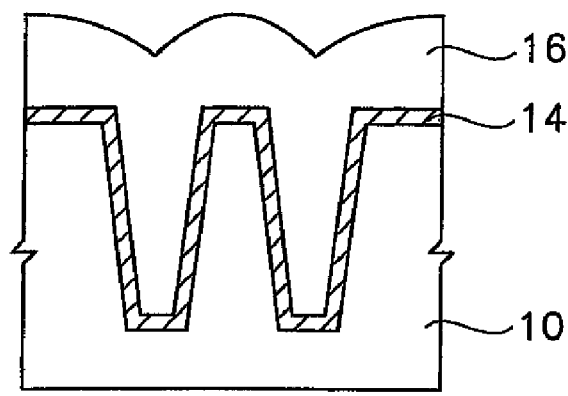
Figure 1D:
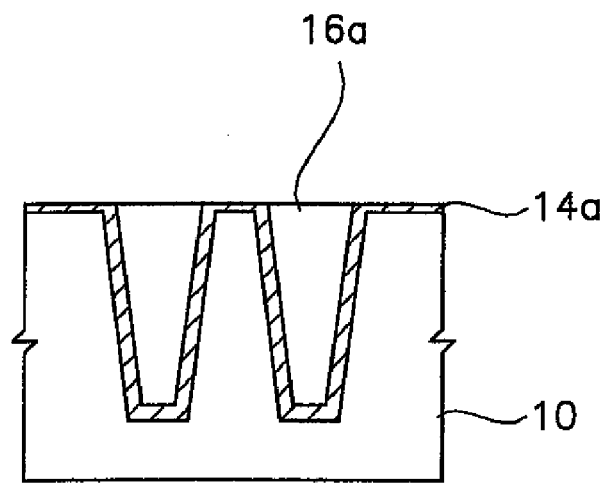
Figure 1E:
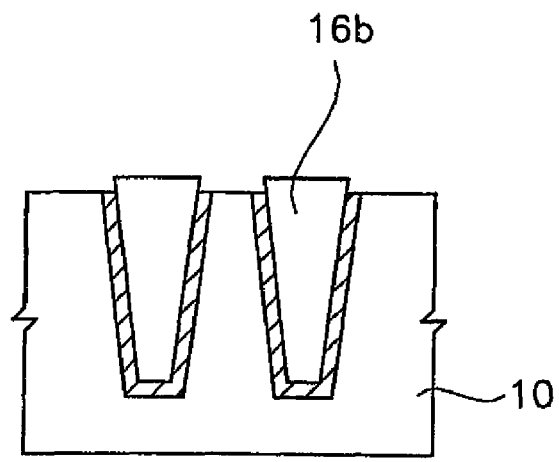
Figure 2:
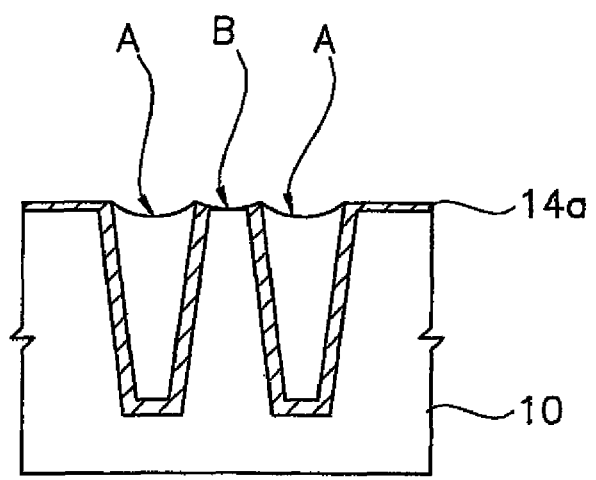
FIG. 2 is a sectional view for explaining a dishing phenomenon generated during manufacturing an STI structure by the conventional polishing method.

Preferred, but non-limiting, embodiments of the present invention are described in detail below.

Additive Composition

An additive composition of the present invention includes first and second salts of polymeric acid. The first salt of polymeric acid includes a fist polymeric acid having a first weight average molecular weight and a first base material, and the second salt of polymeric acid includes a second polymeric acid having a second weight average molecular weight that is larger than the first weight average molecular weight and a second base material.

The preferred pH range of the additive composition of the present invention is from about 4.5 to about 8.8. When the pH of the additive composition is less than 4.5 or exceeds 8.8, the polishing selectivity is unpreferable. More preferably, the pH is in a range of from about 6.0 to about 7.5.

An amount ratio of the first salt of polymeric acid by weight with respect to the second salt of polymeric acid by weight exceeds 1 and is less than 100. Preferably, the amount of the first salt of polymeric acid is in a range of from about 50 to about 95% by weight and the amount of the second salt of polymeric acid is in a range of from about 5 to about 50% by weight based on the sum of the first and the second salts of polymeric acid. When the amount of the first salt of polymeric acid is less than 50% by weight and the amount of the second salt of polymeric acid exceeds 50% by weight, the productivity is decreased and the preparation of the additive composition is not advantageous. When the amount of the first salt of polymeric acid exceeds 95% by weight and the amount of the second salt of polymeric acid is less than 5% by weight, the polishing selectivity is unpreferable. Accordingly, the preferred amount of the first and the second salt of polymeric acid is in the above-described range. More preferably, the amount of the first salt of polymeric acid is in a range of from about 70 to about 90% by weight and the amount of the second salt of polymeric acid is in a range of from about 10 to about 30% by weight based on the sum of the first and the second salts of polymeric acid.

Also, it is preferred that the first weight average molecular weight is from about 1,000 to about 10,000. When the first weight average molecular weight is less than 1,000, the polishing selectivity is unpreferable, and when the first weight average molecular weight exceeds 10,000, the polishing rate is lowered and the viscosity of a slurry composition prepared by including the additive composition is increased.

It is preferred that the second weight average molecular weight is 10 to 1,000 times larger than the first weight average molecular weight. Therefore, it is preferred that the second weight average molecular weight is in a range of from about 10,000 to about 10,000,000.

The additive composition is preferably in the form of a liquid. Particularly, the additive composition is a dispersed liquid type in which the first salt of polymeric acid and the second salt of polymeric acid are dispersed into water. Preferably, the amount of water in the dispersion is in a range of from about 70 to about 99% by weight and the amount of the first and the second salt of polymeric acid is in a range of from about 1 to about 30% by weight.

As for the first polymeric acid, poly(acrylic acid), poly(acrylic acid-co-maleic acid), poly(methyl vinyl ether-alt-maleic acid), etc. can be used. Preferably, one of these compounds is used alone, but a mixture of two or more also can be used. As for the second polymeric acid, poly(acrylic acid), poly(acrylic acid-co-maleic acid), poly(methyl vinyl ether-alt-maleic acid), etc. also can be used. Preferably, one of these compounds is used alone, but a mixture of two or more also can be used.

According to an embodiment of the present invention, poly(acrylic acid) is used which can obtained from the Aldrich Company as a product number of 192023, which is in an aqueous type, 181285 which is in a powder type, etc. The aqueous type product includes poly(acrylic acid) in an amount of about 60% by weight and poly(acrylic acid) has a molecular formula of [—$CH_2CH(CO_2R)$—]n (wherein, n is a positive integer and R denotes an alkyl group). The powder type product includes poly(acrylic acid) having a molecular formula of [—$CH_2CH(CO_2H)$—]n (wherein, n is a positive integer).

According to an embodiment of the present invention, poly(acrylic acid-co-maleic acid) is used which can be obtained from the Aldrich Company as a product number of 416053, which is in an aqueous type. The aqueous type product includes poly(acrylic acid-co-maleic acid) in an amount of about 60% by weight and poly(acrylic acid-co-maleic acid has a molecular formula of [—$CH_2CH(CO_2H)$]x[—$CH(CO_2H)CH(CO_2H)$—]y (wherein, x and y are positive integers).

According to an embodiment of the present invention, poly(methyl vinyl ether-alt-maleic acid) is used which can be obtained from the Aldrich Company as a product number of 191124, which is in a powder type. The powder type product includes poly(methyl vinyl ether-alt-maleic acid) having a molecular formula of [—$CH_2CH(OCH_3)CH(CO_2H)CH(CO_2H)$—]n (wherein, n is a positive integer).

According to an embodiment of the present invention, the first base material includes sodium hydroxide, potassium hydroxide, ammonium hydroxide, base amine compounds, etc. One of these may used alone or a mixture thereof may be used. The base amine compound includes tetra-methyl ammonium hydroxide (TMAH), tetra-ethyl ammonium hydroxide (TEAH), tetra-propyl ammonium hydroxide (TPAH) and tetra-butyl ammonium hydroxide (TBAH), etc. One of these may used alone or a mixture thereof may be used. The second base material includes sodium hydroxide, potassium hydroxide, ammonium hydroxide, base amine compounds, etc. One of these may used alone or a mixture thereof may be used. The base amine compound includes tetra-methyl ammonium hydroxide, tetra-ethyl ammonium hydroxide, tetra-propyl ammonium hydroxide, tetra-butyl ammonium hydroxide, etc. One of these may used alone or a mixture thereof may be used.

According to the first embodiment of the additive composition of the present invention, a dispersed solution prepared by dispersing a first ammonium salt of poly(acrylic acid) including poly(acrylic acid) having a weight average molecular weight of about 2,000 and ammonium hydroxide and a second ammonium salt of poly(acrylic acid) including poly(acrylic acid) having a weight average molecular weight of about 400,000 and ammonium hydroxide, into water is used.

According to the second embodiment of the additive composition of the present invention, a dispersed solution prepared by dispersing a first ammonium salt of poly(acrylic acid) including poly(acrylic acid) having a weight average molecular weight of about 2,000 and ammonium hydroxide and a second ammonium salt of poly(methyl vinyl ether-alt-maleic acid) including poly(methyl vinyl ether-alt-maleic acid) having a weight average molecular weight of about 400,000 and ammonium hydroxide, into water is used.

According to the third embodiment of the additive composition of the present invention, a dispersed solution prepared by dispersing a first ammonium salt of poly(acrylic acid-co-maleic acid) including poly(acrylic acid-co-maleic acid) having a weight average molecular weight of about 2,000 and ammonium hydroxide and a second ammonium salt of poly(acrylic acid) including poly(acrylic acid) having a weight average molecular weight of about 400,000 and ammonium hydroxide, into water is used.

According to the fourth embodiment of the additive composition of the present invention, a dispersed solution prepared by dispersing a first ammonium salt of poly(acrylic acid-co-maleic acid) including poly(acrylic acid-co-maleic acid) having a weight average molecular weight of about 2,000 and ammonium hydroxide and a second ammonium salt of poly(methyl vinyl ether-alt-maleic acid) including poly(methyl vinyl ether-alt-maleic acid) having a weight average molecular weight of about 400,000 and ammonium hydroxide, into water is used.

According to the fifth embodiment of the additive composition of the present invention, a dispersed solution prepared by dispersing a first tetra-methyl ammonium salt of poly(acrylic acid-co-maleic acid) including poly(acrylic acid-co-maleic acid) having a weight average molecular weight of about 3,000 and tetra-methyl ammonium hydroxide and a second tetra-methyl ammonium salt of poly(acrylic acid) including poly(acrylic acid) having a weight average molecular weight of about 250,000 and tetra-methyl ammonium hydroxide, into water is used.

In addition to the above-illustrated dispersions, various types of additive compositions can be prepared according to requirements.

Slurry Composition

The slurry composition of the present invention includes an additive composition of a slurry composition, a polishing particle composition, and water. That is, the slurry composition includes an additive composition including a first salt of polymeric acid which has a first polymeric acid having a first weight average molecular weight and a first base material, and a second salt of polymeric acid which has a second polymeric acid having a second weight average molecular weight and a second base material, a polishing particle composition having polishing particles, and water. The additive composition and the polishing particle composition may each include water prior to mixing.

The preferred pH of the slurry composition is in a range of from about 5.0 to about 8.0. When the pH of the slurry composition is less than 5.0 or when exceeds 8.0, the polishing selectivity is unpreferable. More preferably, the pH is in a range of from about 6.5 to about 7.5.

The preferred amount of the additive composition in the slurry composition is in a range of from about 0.3 to about 20% by weight. When the amount of the additive composition is less than 0.3% by weight or exceeds 20% by weight, the polishing selectivity is unpreferable.

The preferred amount of the polishing composition in the slurry composition is in a range of from about 0.3 to about 20% by weight. When the amount of the polishing composition is less than 0.3% by weight, the polishing rate is lowered. And when the amount of the polishing composition exceeds 20% by weight, undesirable scratches are formed on the polishing surface.

The preferred amount of water in the slurry is in a range of from about 60 to about 99.4% by weight. When the amount of water is less than 60% by weight, the preparation of the slurry composition is not advantageous, and when the amount of water exceeds 99.4%, the polishing efficiency is deteriorated.

When considering the above, the preferred slurry composition includes from about 0.3% by weight to about 20% by weight of the additive composition, from about 0.3% by weight to about 20% by weight of the polishing particle composition, and from about 60% by weight to about 99.4% by weight of water.

The preferred viscosity of the slurry composition is in a range of from about $1.0 \times 10^{-3}$ PaS (1 PaS=1 Ps) to about $3.0 \times 10^{-3}$ PaS. When the viscosity is less than $1.0 \times 10^{-3}$ PaS, or exceeds $3.0 \times 10^{-3}$ PaS, dispersing stability of the slurry composition is unpreferable. When the dispersing stability is unpreferable, a uniform deposition of the slurry composition is not accomplished, thereby resulting a non-uniform polishing. The viscosity of the slurry composition also is affected by the first and the second weight average molecular weights of the first and the second salts of polymeric acid.

According to an embodiment, the polishing particle is at least one selected from the group consisting of silica, alumina, cerium oxide and zirconium oxide.

According to the first embodiment of the slurry composition of the present invention, the additive composition includes a first ammonium slat of poly(acrylic acid) including poly(acrylic acid) having a weight average molecular weight of about 2,000 and ammonium hydroxide and a second ammonium salt of poly(acrylic acid) including poly(acrylic acid) having a weight average molecular weight of about 400,000 and ammonium hydroxide and the polishing particle composition includes cerium oxide as the polishing particle.

According to the second embodiment of the slurry composition of the present invention, the additive composition includes a first ammonium slat of poly(acrylic acid) including poly(acrylic acid) having a weight average molecular weight of about 2,000 and ammonium hydroxide and a second ammonium salt of poly(methyl vinyl ether-alt-maleic acid) including poly(methyl vinyl ether-alt-maleic acid) having a weight average molecular weight of about 400,000 and ammonium hydroxide and the polishing particle composition includes cerium oxide as the polishing particle.

According to the third embodiment of the slurry composition of the present invention, the additive composition includes a first tetra-methyl ammonium salt of poly(acrylic acid-co-maleic acid) including poly(acrylic acid-co-maleic acid) having a weight average molecular weight of about 3,000 and tetra-methyl ammonium hydroxide and a second tetra-methyl ammonium salt of poly(acrylic acid) including poly(acrylic acid) having a weight average molecular weight of about 250,000 and tetra-methyl ammonium hydroxide and the polishing particle composition includes cerium oxide as the polishing particle.

In addition to the above slurry compositions, various types of slurry compositions can be prepared according to requirements.

Polishing Method

Figure 3:
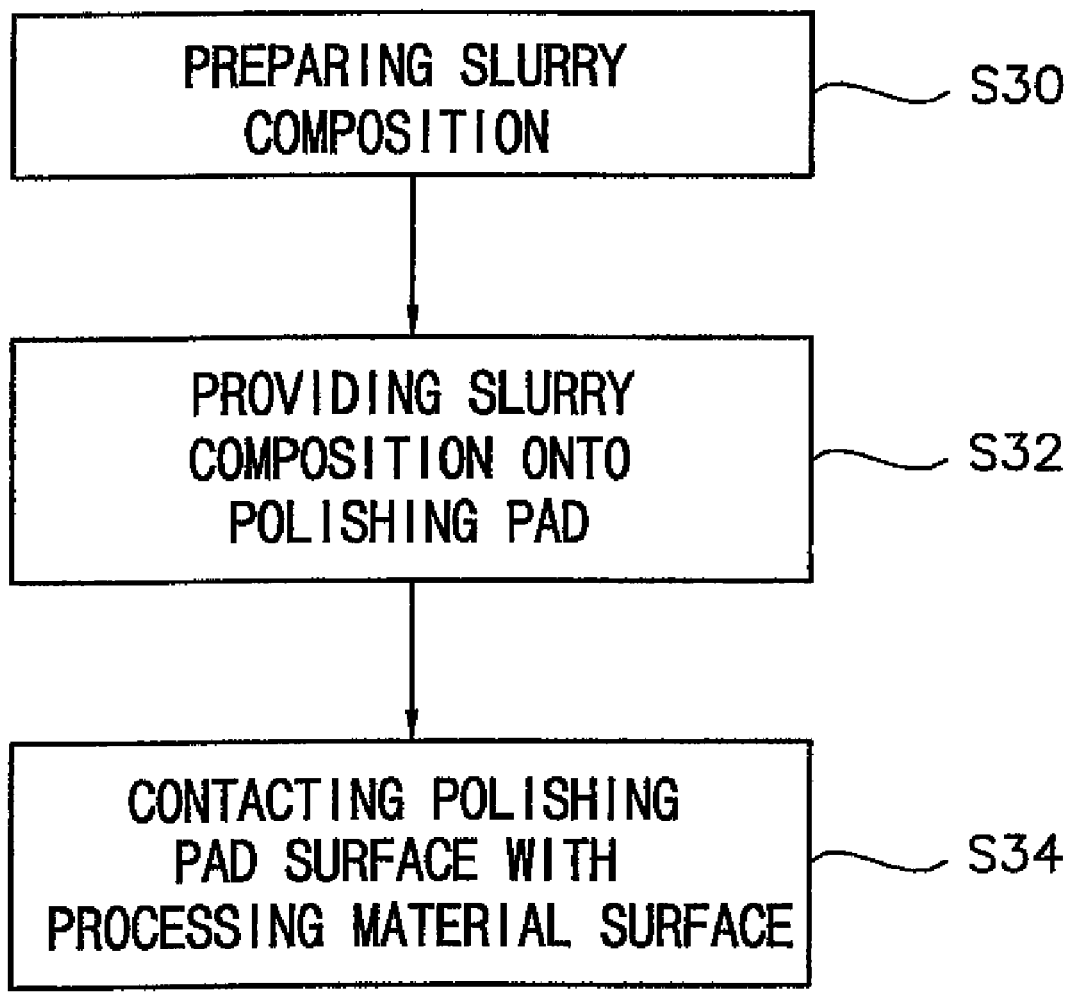
FIG. 3 is a flow chart for explaining a polishing method according to an embodiment of the present invention.

FIG. 3 is a flow chart for explaining a polishing method according to an embodiment of the present invention.

First, the slurry composition is prepared (step S30). The slurry composition includes an additive composition which contains a first salt of polymeric acid of a first polymeric acid having a first weight average molecular weight and a first base material, and a second salt of polymeric acid of a second polymeric acid having a second weight average molecular weight which is larger than the first weight average molecular weight and a second base material, a polishing particle composition including polishing particles, and water.

According to the first embodiment of the present invention, the slurry composition includes an additive composition which contains a first ammonium salt of poly(acrylic acid) including poly(acrylic acid) of a weight average molecular weight of about 2,000 and ammonium hydroxide and a second ammonium salt of poly(acrylic acid) including poly(acrylic acid) of a weight average molecular weight of about 400,000 and ammonium hydroxide, a polishing particle composition including cerium oxide and water. More preferably, the polishing particle composition further includes a dispersing agent for a stable dispersion.

According to the second embodiment of the present invention, the slurry composition includes an additive composition which contains a first ammonium salt of poly(acrylic acid) including poly(acrylic acid) of a weight average molecular weight of about 2,000 and ammonium hydroxide and a second ammonium salt of poly(methyl vinyl ether-alt-maleic acid) including poly(methyl vinyl ether-alt-maleic acid) of a weight average molecular weight of about 400,000 and ammonium hydroxide, a polishing particle composition including cerium oxide and water. More preferably, the polishing particle composition further includes a dispersing agent for a stable dispersion.

Then, the slurry composition is provided onto a polishing pad (step S32). For example, the slurry composition is provided onto the polishing pad through a nozzle having an outlet positioned above the polishing pad.

Thereafter, a material to be processed is brought into contact with the polishing pad in order to polish the surface of the material to be processed (step S34).

Here, when the material to be processed is a substrate on which a first material layer and a different second material layer are integrated, the polishing rate of the first material layer and the polishing rate of the second material layer are different when using the slurry composition of the present invention. Particularly, when the first material layer is a silicon nitride layer and the second material layer is a silicon oxide layer, the polishing rate of the silicon oxide layer is about 40-70 times faster than that of the silicon nitride layer.

A method of polishing the material to be processed on which the silicon nitride layer and the silicon oxide layer are subsequently integrated, will be described in detail below.

Figure 4A:
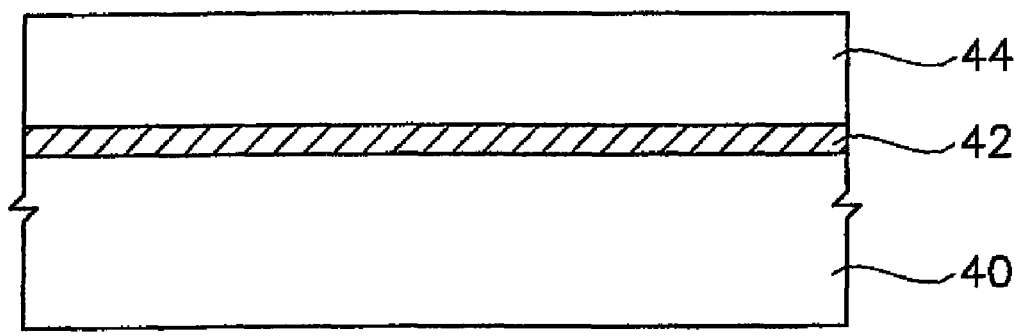
FIGS. 4A and 4B are sectional views for explaining a polishing method illustrated in FIG. 3.
Figure 4B:
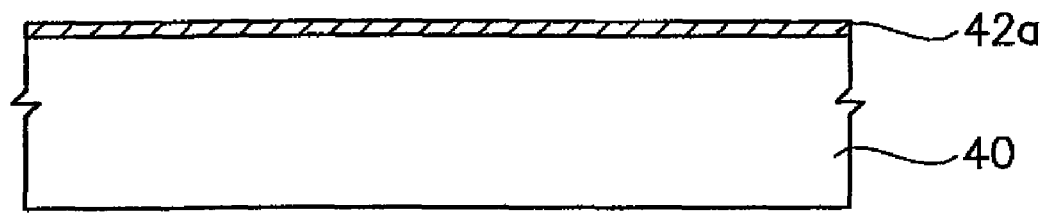

FIGS. 4A and 4B are sectional views for explaining a polishing method illustrated in FIG. 3.

Referring to FIG. 4A, a silicon nitride layer 42 and a silicon oxide layer 44 are subsequently integrated on a silicon substrate 40.

Referring to FIG. 4B, the silicon oxide layer 44 is polished and the silicon nitride layer 42a is exposed. Typically, the polishing is implemented by a mechanical polishing using a polishing pad and a chemical polishing using the slurry composition. The polishing is performed so that a portion of the silicon nitride layer 42 is polished, that is, an over-polishing is executed.

The over-polishing utilizes the difference in polishing rates between the silicon oxide layer 44 and the silicon nitride layer 42. That is, the polishing rate of the silicon oxide layer 44 is adjusted to be faster than the polishing rate of the silicon nitride layer 42 during the over-polishing. Accordingly, the silicon oxide layer 44 formed on the silicon nitride layer 42 can be completely polished by the over-polishing.

The difference in the polishing rate is accomplished by the slurry composition used for the polishing. The slurry composition of the invention allows for the polishing rate of the silicon oxide layer 44 to be about 40-70 times faster than that of the silicon nitride layer 42.

Accordingly, the polishing method using the slurry composition of the present invention can be advantageously applied to the fabrication of an STI structure. In particular, the polishing method can be applied for the fabrication of an STI structure of a semiconductor device having a design rule of about 0.13 μm or less. The high polishing selectivity minimizes the generation of dishing and erosion of the STI structure. In addition, because the silicon oxide layer is polished faster than the silicon nitride layer, a thin silicon nitride layer can be formed.

As described above, the generation of defects during polishing can be minimized by using the slurry composition of the present invention. Further, the thickness of a polish stop layer such as the silicon nitride layer can be decreased. This sufficiently satisfies the recent requirement of fabricating a minute pattern of a semiconductor device.

The working examples of the present invention will be described in detail below.

Preparation of Additive Composition

Example 1

1-i) An aqueous poly(acrylic acid) solution available from Aldrich company by a product number of 192023, was prepared. A weight average molecular weight of poly(acrylic acid) was about 2,000 An amount of poly(acrylic acid) was 65% by weight based on the aqueous solution.

1-ii) A powder type poly(acrylic acid) available from Aldrich company by a product number of 181285 was prepared. A weight average molecular weight of poly(acrylic acid) was about 450,000.

1-iii) The powder type poly(acrylic acid) was mixed with water having a weight of about three times of the powder type poly(acrylic acid) and the thus obtained mixture was stirred by means of a stirrer for about one hour to completely dissolve the powder into water.

1-iv) The aqueous solution obtained from step 1-i) was added into a 500 Ml beaker and then ammonium hydroxide was added into the aqueous solution to adjust pH of the solution to about 6.5. In order to adjust the pH, the solution was stirred to about 200 rpm by using a magnetic stirrer.

1-v) The pH of the solution obtained from the step 1-iii) was adjusted by implementing the same procedure described in the step of 1-iv).

1-vi) Two solutions prepared by the steps 1-iv) and 1-v) were mixed in a mixing ratio of about 8:2 by weight when considering only organic contents excluding water. Then, the total content of non-volatile components was adjusted to about 3% by weight by diluting the mixture using water.

By carrying out the steps from 1-i) to 1-vi), an additive composition of a slurry was prepared. The pH of the thus prepared additive composition was about 6.5 and the content of the non-volatile components was about 3% by weight.

The content of the non-volatile components of the additive composition was measured by the following method.

First, a vacant aluminum dish was weighed (A). Then, about 3 Ml of the additive composition was added into the aluminum dish and the total weight was measured (B). The aluminum dish including the additive composition was heated to about 110° C. for about 1 hour for drying. Then, the dish was weighed (C). The total content of the non-volatile components (D) was calculated according to the following equation 1.

$$D(\% \text{ by weight}) = (C-A)/(B-A) \times 100 \qquad \text{[Equation 1]}$$

Example 2

An additive composition of a slurry was prepared in the same manner as in Example 1 except that a powder type poly(methyl vinyl ether-alt-maleic acid) available from Aldrich company by a product number of 191124 was used instead of poly(acrylic acid) introduced in the step 1-ii) of Example 1. The weight average molecular weight of the poly(methyl vinyl ether alt-maleic acid) was about 216,000. The pH of the thus prepared additive composition was about 6.5 and the total content of the non-volatile components was about 3% by weight.

Example 3

An additive composition of a slurry was prepared in the same manner as in Example 1 except that an aqueous type poly(acrylic acid-co-maleic acid) available from Aldrich company by a product number of 414053 was used instead of poly(acrylic acid) introduced in the step 1-i) of Example 1. The weight average molecular weight of poly(acrylic acid-co-maleic acid) was about 3,000. The amount of poly(acrylic acid-co-maleic acid) in the aqueous solution was about 50% by weight. The pH of the thus prepared additive composition was about 6.5 and the total content of the non-volatile components was about 3% by weight.

Example 4

An additive composition of a slurry was prepared in the same manner as in Example 1 except that poly(acrylic acid-co-maleic acid) used in Example 3 was used instead of poly (acrylic acid) introduced in the step 1-i) in Example 1 and poly(methyl vinyl ether-alt-maleic acid) used in Example 2 was used instead of poly(acrylic acid) introduced in the step 1-ii) of Example 1. The amount of poly(acrylic acid-co-maleic acid) in the aqueous solution was about 50% by weight.

The pH of the thus prepared additive composition was about 6.5 and the total content of the non-volatile components was about 3% by weight.

Example 5

An additive composition of a slurry was prepared in the same manner as in Example 1 except that poly(acrylic acid-co-maleic acid) having a weight average molecular weight of about 3,000 was used instead of poly(acrylic acid) introduced in the step 1-i) in Example 1 and poly(acrylic acid) having a weight average molecular weight of about 250,000 was used instead of poly(acrylic acid) introduced in the step 1-ii) of Example 1. Further, tetra-methyl ammonium hydroxide was used as the base material instead of ammonium hydroxide used in Example 1. The pH of the thus prepared additive composition was about 6.5 and the total content of the non-volatile components was about 3% by weight.

Preparation of a Slurry Composition

Example 6

An additive composition prepared by Example 1 was used for the preparation of a slurry composition. Cesium oxide slurry composition available from Hitachi Co. by a product name of HS8005 was used as for the polishing particle composition. Then the polishing particle composition, the additive composition and water were mixed at a mixing ratio of 1:3:3 by volume to prepare a slurry composition. The pH of the thus prepared slurry composition was about 7.1.

Example 7

An additive composition prepared by Example 5 was used for the preparation of a slurry composition. Cesium oxide slurry composition available from Hitachi Co. by a product name of HS8005 was used as for the polishing particle composition. Then the polishing particle composition, the additive composition and water were mixed at a mixing ratio of 1:4:3 by volume to prepare a slurry composition. The pH of the thus prepared slurry composition was about 7.0±0.5.

Polishing Test

Experiment 1

A first material to be processed was prepared on which a silicon oxide layer having about 6,000 Å thickness was formed. A second material to be processed was prepared on which a silicon nitride layer having about 1,500 Å thickness was formed. The first and the second materials were, respectively, polished by using the slurry composition prepared by Example 6 and using a polishing apparatus of STRASBAUGH 6EC. The polishing condition are illustrated in the following Table 1:

TABLE 1

|  | Condition |
|---|---|
| Down force onto material to be processed | 4.0 psi |
| Back pressure onto the backside of polishing pad | 1.5 psi |
| Table speed of polishing pad | 70 rpm |
| Head speed of material to be processed | 70 rpm |
| Polishing time | 1 min |
| Slurry composition flow rate | 150 Ml/min |

After completing the polishing according to the conditions in Table 1, the polishing rates of the first and the second material were measured.

The polishing rate was obtained by the following method. First, the thickness of the silicon oxide layer (D1) and the thickness of the silicon nitride layer (D2) were measured before implementing the polishing. Also, the thickness of the silicon oxide layer (D3) and the thickness of the silicon nitride layer (D4) were measured after implementing the polishing. Then, the thickness difference of each layer, D1-D3 for the silicon oxide layer and D2-D4 for the silicon nitride layer was, respectively, divided by the unit polishing time to obtain the polishing rate. At this time, the thickness of the layer was measured by means of an Opti-probe for 49 points.

From the result of measuring 49 points, the polishing selectivity, represented by the ratio of the polishing rate of the silicon oxide layer with respect to that of the silicon nitride layer, was about 70:1.

Experiment 2

On a silicon substrate having a trench, a silicon nitride layer and a silicon oxide layer were subsequently formed. The trench had a depth of about 3,500 Å. The silicon nitride layer had a thickness of about 1,000 Å and was continuously formed on the side wall portion of the trench, on the bottom portion of the trench and on the surface of the silicon substrate. The silicon oxide layer was formed on the silicon nitride layer to a thickness of about 8,000 Å. The silicon oxide layer completely filled the recessed portion of the trench.

A pre-polishing was implemented for about 1 minute by using a slurry composition prepared by diluting SS25 available from CABOT company to about 12%. The pre-polishing was executed to somewhat lessen the step portion generated after forming the silicon oxide layer.

Then, polishing was implemented for 3 minutes with an interval of 30 seconds according to the same polishing method described in Experiment 1. After completing the polishing, the silicon oxide layer remained in the recessed portion of the trench and the silicon nitride layer having a thickness of about 950 Å remained on the substrate. Then, the silicon nitride layer was etched to form an STI structure.

When inspecting the STI structure, no dishing and no erosion were observed.

Therefore, it is apparent that the dishing of the silicon oxide layer and the erosion of the silicon nitride layer can be minimized when the slurry composition was applied to the manufacture of the STI structure.

Characteristics of the slurry composition will be described below.

Polishing Characteristics

The additive composition included in the slurry composition selectively makes a bond with the silicon nitride layer during polishing and, as a result, the polishing of the silicon nitride layer is restrained.

Figure 5:
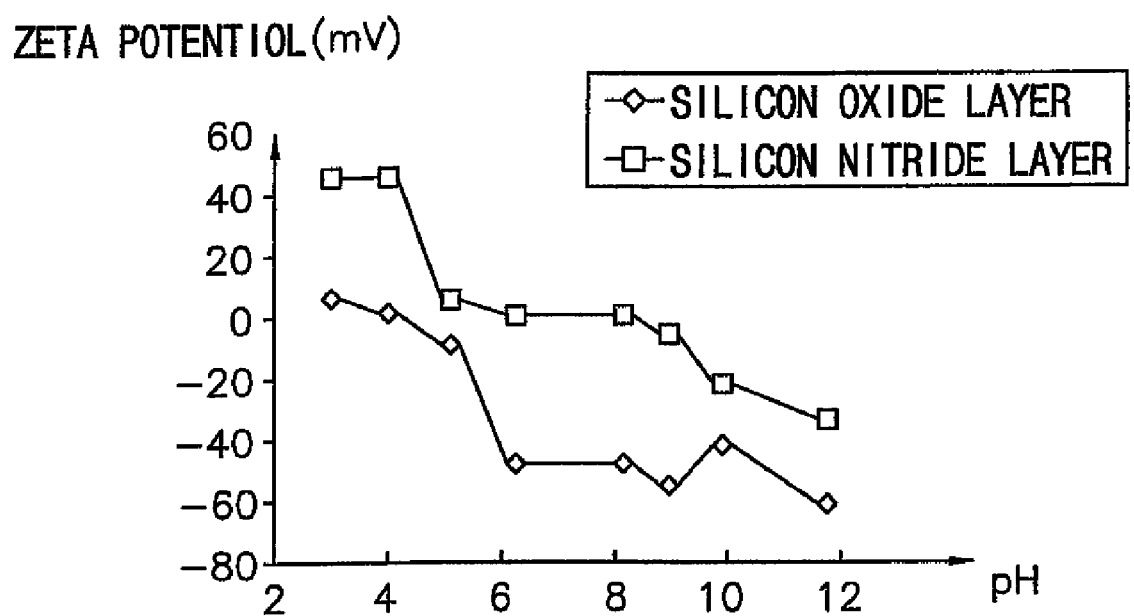
FIG. 5 is a graph illustrating a zeta potential of a silicon oxide layer and a silicon nitride layer with respect to the pH of an additive composition of the present invention.

FIG. 5 is a graph illustrating a zeta potential of a silicon oxide layer and a silicon nitride layer with respect to the pH of an additive composition of the present invention.

Referring to FIG. 5, the zeta potential of the silicon nitride layer (□) is higher than that of the silicon oxide layer (◇) through the whole range of the pH of the slurry composition. In particular, in the pH range of from about 5 to about 8, the zeta potential of the silicon oxide layer is negative, and the zeta potential of the silicon nitride layer is positive. Therefore, the restraining of the polishing of the silicon nitride layer can be effectively accomplished. Since the polishing of the silicon nitride layer is restrained when using the slurry composition including the additive composition, the polishing selectivity of about 70:1 can be maintained.

Figure 6:
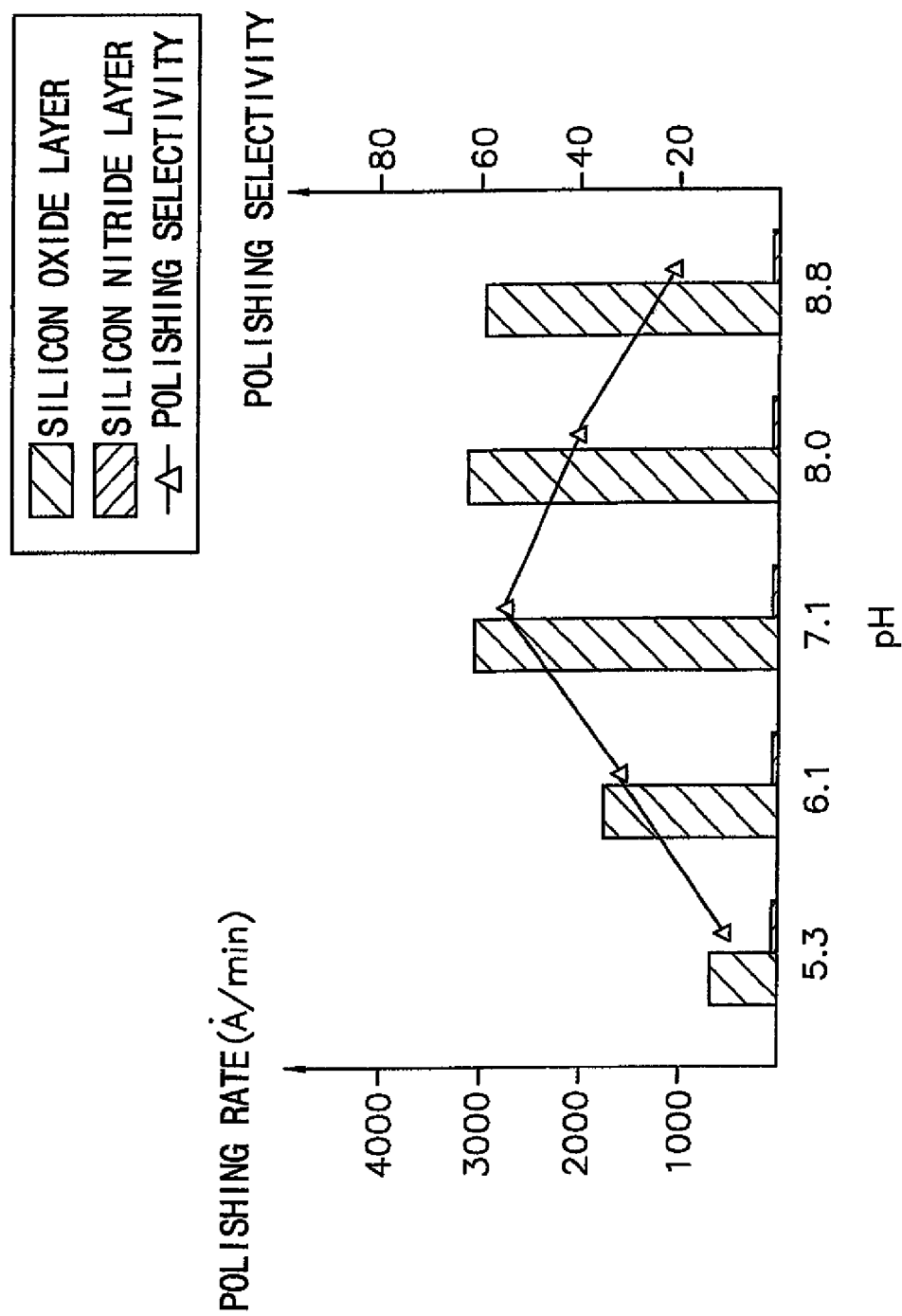
FIG. 6 is a graph illustrating a polishing selectivity and a polishing rate with respect to the pH of a slurry composition of the present invention.

Polishing Selectivity and Polishing Rate of the Slurry Composition According to pH Range FIG. 6 is a graph illustrating a polishing selectivity and a polishing rate with respect to the pH of a slurry composition of the present invention. The polishing rates of the silicon nitride layer and the silicon oxide layer are illustrated. The slurry composition prepared by Example 6 was used while changing the pH value.

Referring to FIG. 6, when a slurry composition having a pH of 5.3 was used, the polishing rate of the silicon oxide layer was about 500 Å/min while the polishing rate of the silicon nitride layer was about 50 Å/min. Therefore, it can be noted that the polishing selectivity of the silicon oxide layer to the silicon nitride layer is about 10:1.

When a slurry composition having a pH of 6.1 was used, the polishing rate of the silicon oxide layer was about 1,800 Å/min while the polishing rate of the silicon nitride layer was about 60 Å/min. Therefore, it can be noted that the polishing selectivity of the silicon oxide layer to the silicon nitride layer is about 30:1.

When a slurry composition having a pH ofs 7.1 was used, the polishing rate of the silicon oxide layer was about 3,300 Å/min while the polishing rate of the silicon nitride layer was about 55 Å/min. Therefore, it can be noted that the polishing selectivity of the silicon oxide layer to the silicon nitride layer is about 60:1.

When a slurry composition having a pH of 8.0 was used, the polishing rate of the silicon oxide layer was about 3,500 Å/min while the polishing rate of the silicon nitride layer was about 100 Å/min. Therefore, it can be noted that the polishing selectivity of the silicon oxide layer to the silicon nitride layer is about 35:1.

When a slurry composition having pH of 8.8 was used, the polishing rate of the silicon oxide layer was about 3,000 Å/min while the polishing rate of the silicon nitride layer was about 150 Å/min. Therefore, it can be noted that the polishing selectivity of the silicon oxide layer to the silicon nitride layer is about 20:1.

From the above experiments, it can be noted that the polishing rate of the silicon oxide layer is lowered when the pH of the slurry composition is decreased to the acid range, while the polishing rate of the silicon nitride layer is increased when the pH of the slurry composition is increased to the base range.

Accordingly, an appropriate pH range of the slurry composition is from about 5.0 to about 8.0.

Figure 7:
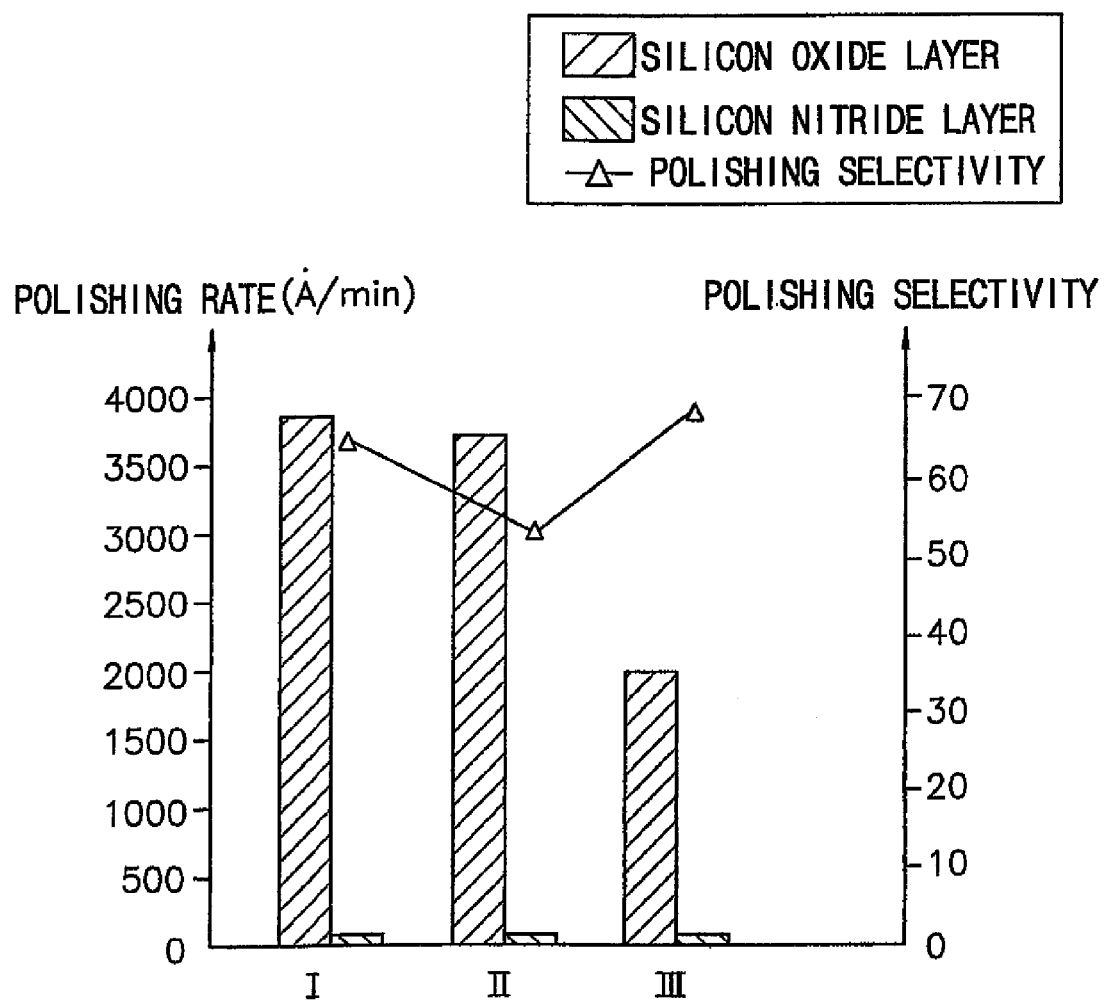
FIG. 7 is a graph illustrating a polishing selectivity and a polishing rate of slurries having different additive compositions of the present invention.

Polishing Selectivity and Polishing Rate According to the kind of the an Additive Composition FIG. 7 is a graph illustrating a polishing selectivity and a polishing rate for different additive compositions of the present invention. In FIG. 7, a polishing rate of a silicon nitride layer and a polishing rate of a silicon oxide layer are also illustrated.

Referring to FIG. 7, result I was obtained after polishing the silicon oxide layer and the silicon nitride layer by using a slurry composition including an additive composition containing an ammonium salt of poly(acrylic acid). The additive composition has a pH of about 6.5 and a weight average molecular weight of poly(acrylic acid) was about 2,000. The polishing rate of the silicon oxide layer was about 3,700 Å/min and the polishing rate of the silicon nitride layer was about 57 Å/min. Accordingly, it can be noted that the polishing selectivity of the silicon oxide layer with respect to the silicon nitride layer is about 65:1.

Result II was obtained after polishing the silicon oxide layer and the silicon nitride layer by using a slurry composition including an additive composition having an ammonium salt of poly(acrylic acid-co-maleic acid). The additive composition has a pH of about 6.5 and a weight average molecular weight of poly(acrylic acid-co-maleic acid) was about 2,000. The polishing rate of the silicon oxide layer was about 3,600 Å/min and the polishing rate of the silicon nitride layer was about 65 Å/min. Accordingly, it can be noted that the polishing selectivity of the silicon oxide layer with respect to the silicon nitride layer is about 55:1.

Result III was obtained after polishing the silicon oxide layer and the silicon nitride layer by using a slurry composition including an additive composition having an ammonium salt of poly(methyl vinyl ether-alt-maleic acid). The additive composition has a pH of about 6.5 and a weight average molecular weight of poly(methyl vinyl ether-alt-maleic acid) was about 2,000. The polishing rate of the silicon oxide layer was about 2,000 Å/min and the polishing rate of the silicon nitride layer was about 28 Å/min. Accordingly, it can be noted that the polishing selectivity of the silicon oxide layer with respect to the silicon nitride layer is about 70:1.

From the result in FIG. 7, it can be noted that the additive composition including poly(acrylic acid), poly(acrylic acid-co-maleic acid) or poly(methyl vinyl ether-alt-maleic acid) shows suitable characteristics for use in the preparation of a slurry composition of the present invention.

Figure 8:
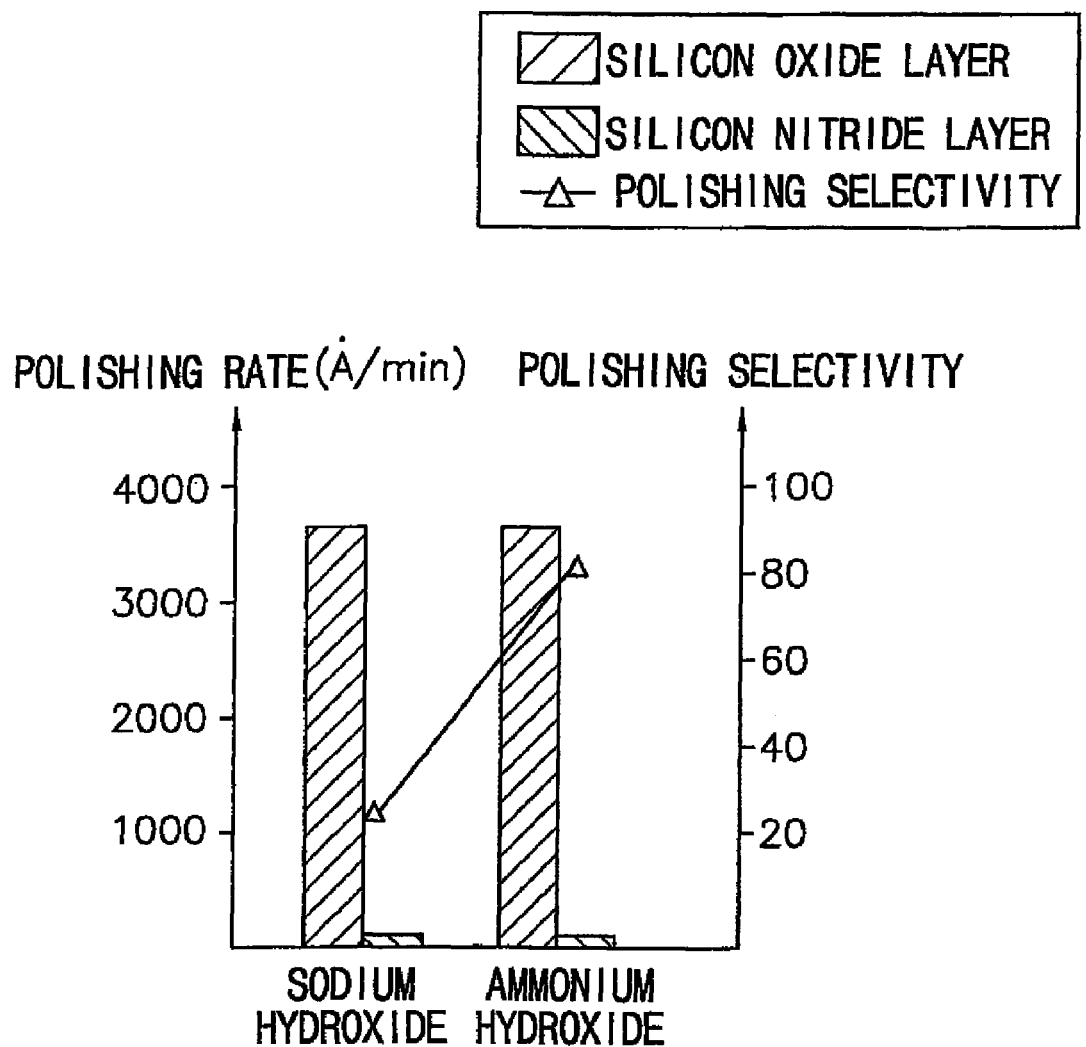
FIGS. 8 and 9 are graphs illustrating a polishing selectivity and a polishing rate of slurries having different base material of the present invention.

Polishing Selectivity and Polishing Rate According to the kind of a Base Material FIG. 8 is a graph illustrating a polishing selectivity and polishing rates when using a slurry composition including sodium hydroxide and ammonium hydroxide as a base material. The slurry composition used for the polishing includes the same components prepared by Example 6 except that the above-described base material and poly(acrylic acid) having a weight average molecular weight of about 2,000 are included.

The polishing rate of the silicon oxide layer was about 3,600 Å/min and the polishing rate of the silicon nitride layer was about 120 Å/min when a slurry composition including sodium hydroxide as the base material, was used. Accordingly, it was found that the polishing selectivity of the silicon oxide layer with respect to the silicon nitride layer is about 30:1.

The polishing rate of the silicon oxide layer was about 3,700 Å/min and the polishing rate of the silicon nitride layer was about 50 Å/min when a slurry composition including ammonium hydroxide as the base material, was used. Accordingly, it can be noted that the polishing selectivity of the silicon oxide layer with respect to the silicon nitride layer is about 75:1.

Figure 9:
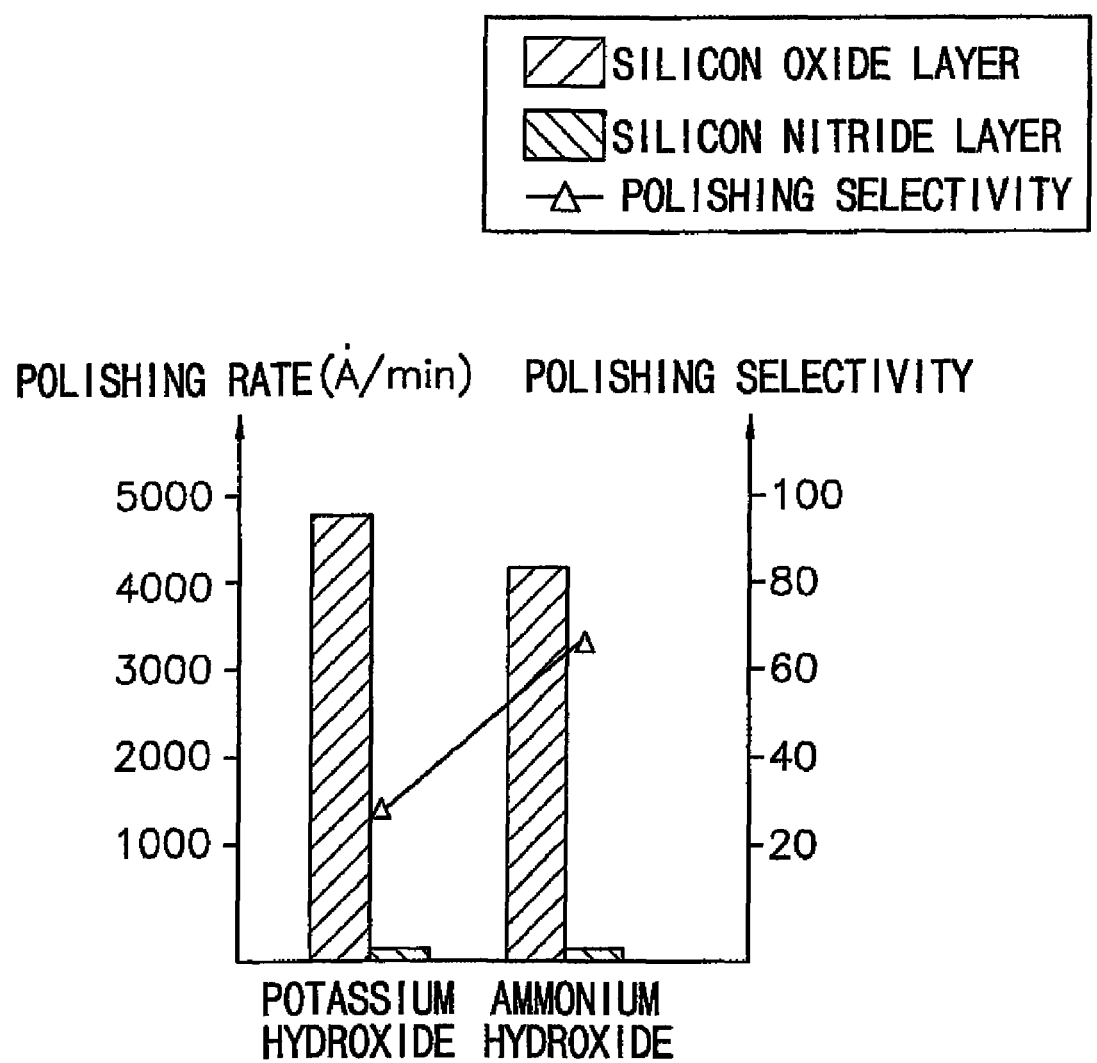

FIG. 9 is a graph illustrating a polishing selectivity and polishing rates when using a slurry composition including potassium hydroxide and ammonium hydroxide as a base material. The slurry composition used for the polishing includes the same components prepared by Example 6 except that the above-described base material and poly(acrylic acid-co-maleic acid) having a weight average molecular weight of about 3,000 are included.

The polishing rate of the silicon oxide layer was about 4,800 Å/min and the polishing rate of the silicon nitride layer was about 160 Å/min when a slurry composition including potassium hydroxide as the base material, was used. Accordingly, it can be noted that the polishing selectivity of the silicon oxide layer with respect to the silicon nitride layer is about 30:1.

The polishing rate of the silicon oxide layer was about 4,500 Å/min and the polishing rate of the silicon nitride layer was about 75 Å/min when a slurry composition including ammonium hydroxide as the base material, was used. Accordingly, it can be noted that the polishing selectivity of the silicon oxide layer with respect to the silicon nitride layer is about 60:1.

Figure 10:
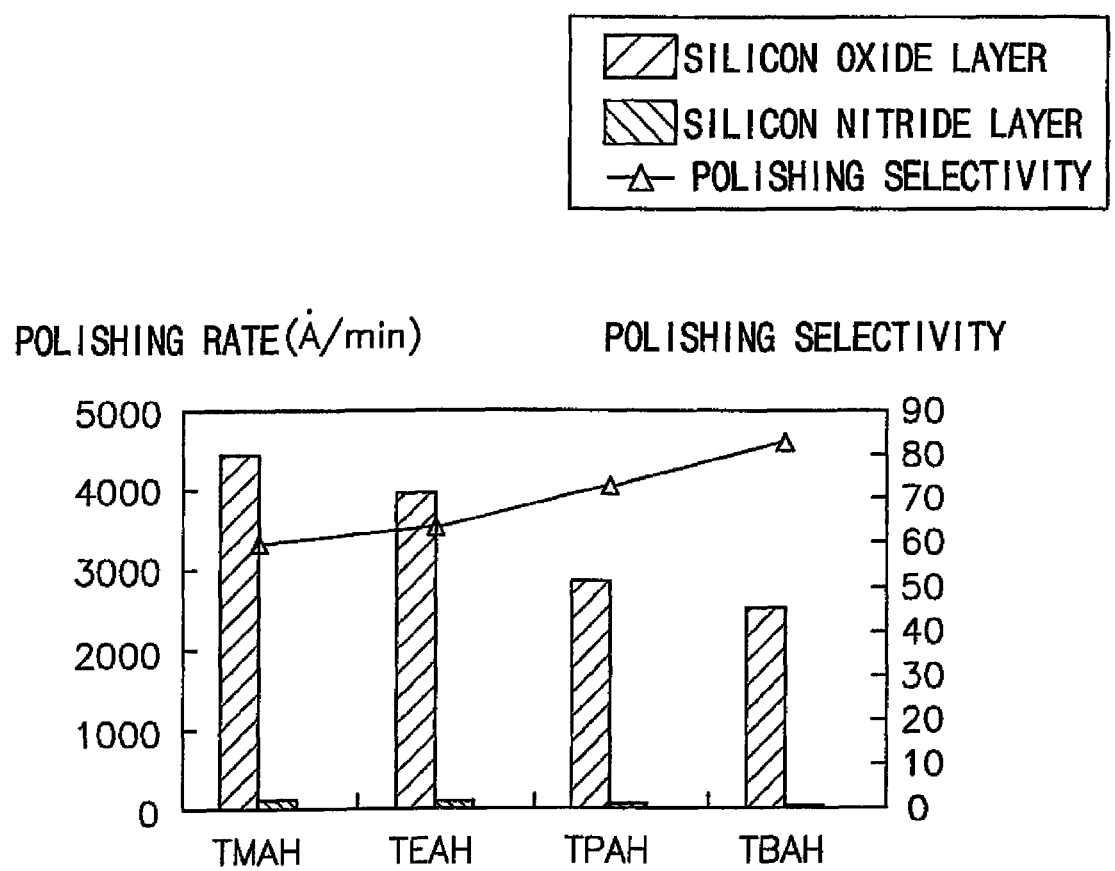
FIG. 10 is a graph illustrating a polishing selectivity and a polishing rate slurries having different additive compositions of the present invention.

FIG. 10 is a graph illustrating a polishing selectivity and a polishing rates for different additive compositions, which include TMAH, TEAH, TPAH or TBAH. The slurry composition used for the polishing includes the same components prepared by Example 6 except that the above-described base material and poly(acrylic acid-co-maleic acid) having a weight average molecular weight of about 3,000 are included.

The polishing rate of the silicon oxide layer was about 4,500 Å/min and the polishing rate of the silicon nitride layer was about 75 Å/min when a slurry composition including TMAH as the base material, was used. Accordingly, it can be noted that the polishing selectivity of the silicon oxide layer with respect to the silicon nitride layer is about 60:1.

The polishing rate of the silicon oxide layer was about 3,950 Å/min and the polishing rate of the silicon nitride layer was about 62 Å/min when a slurry composition including TEAH as the base material, was used. Accordingly, it was found that the polishing selectivity of the silicon oxide layer with respect to the silicon nitride layer is about 64:1.

The polishing rate of the silicon oxide layer was about 2,950 Å/min and the polishing rate of the silicon nitride layer was about 40 Å/min when a slurry composition including TPAH as the base material, was used. Accordingly, it can be noted that the polishing selectivity of the silicon oxide layer with respect to the silicon nitride layer is about 74:1.

The polishing rate of the silicon oxide layer was about 2,550 Å/min and the polishing rate of the silicon nitride layer was about 31 Å/min when a slurry composition including TBAH as the base material, was used. Accordingly, it can be noted that the polishing selectivity of the silicon oxide layer with respect to the silicon nitride layer is about 82:1.

From the above, it can be seen that sodium hydroxide, potassium hydroxide, ammonium hydroxide, TMAH, TEAH, TPAH, TBAH, etc. can be appropriately used as the base material. More preferably, ammonium hydroxide, TMAH, TEAH, TPAH, TBAH, etc. can be used.

Figure 11:
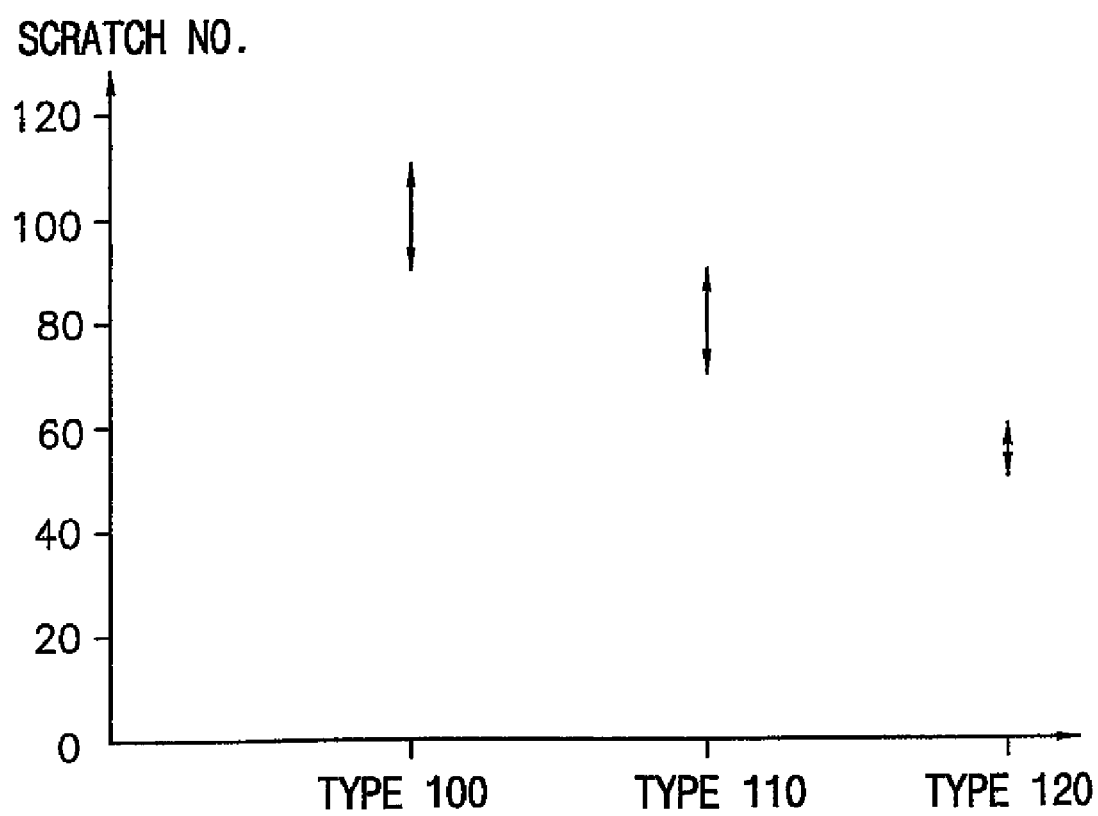
FIG. 11 is a graph showing the number of scratches generated after completing polishing using a slurry composition including an additive composition and a base material according to the present invention.

FIG. 11 is a graph showing the number of scratches formed after polishing using a slurry composition including an additive composition and a base according to the present invention. Slurry compositions of type 100, type 110 and type 120 are used for the polishing.

Here, the slurry composition of type 100 includes an additive composition containing an ammonium salt of poly (acrylic acid-co-maleic acid) having a weight average molecular weight of about 3,000. The slurry composition of type 110 includes an additive composition containing an ammonium salt of poly(acrylic acid-co-maleic acid) having a weight average molecular weight of about 3,000 and an ammonium slat of poly(acrylic acid) having a weight average molecular weight of about 250,000. The slurry composition of type 120 includes an additive composition containing a tetra-methyl ammonium salt of poly(acrylic acid-co-maleic acid) having a weight average molecular weight of about 3,000 and a tetra-methyl ammonium salt of poly(acrylic acid) having a weight average molecular weight of about 250,000.

The result in FIG. 11 was obtained after completing polishing of two substrates for each type of the slurry composition.

The number of the scratches after completing the polishing was 91 and 109 when using the slurry composition of type 100. The number of the scratches after completing the polishing was 78 and 88 when using the slurry composition of type 110. The number of the scratches after completing the polishing was 49 and 59 when using the slurry composition of type 120.

From the results, it can be noted that the number of scratches generated after polishing is smallest when using the slurry composition of type 120.

Therefore, the slurry composition including tetra-methyl ammonium salt as the base material is preferably applied for the polishing. Further, when considering the polishing rate, a slurry composition including a base amine compound for the base material is preferably used.

Figure 12:
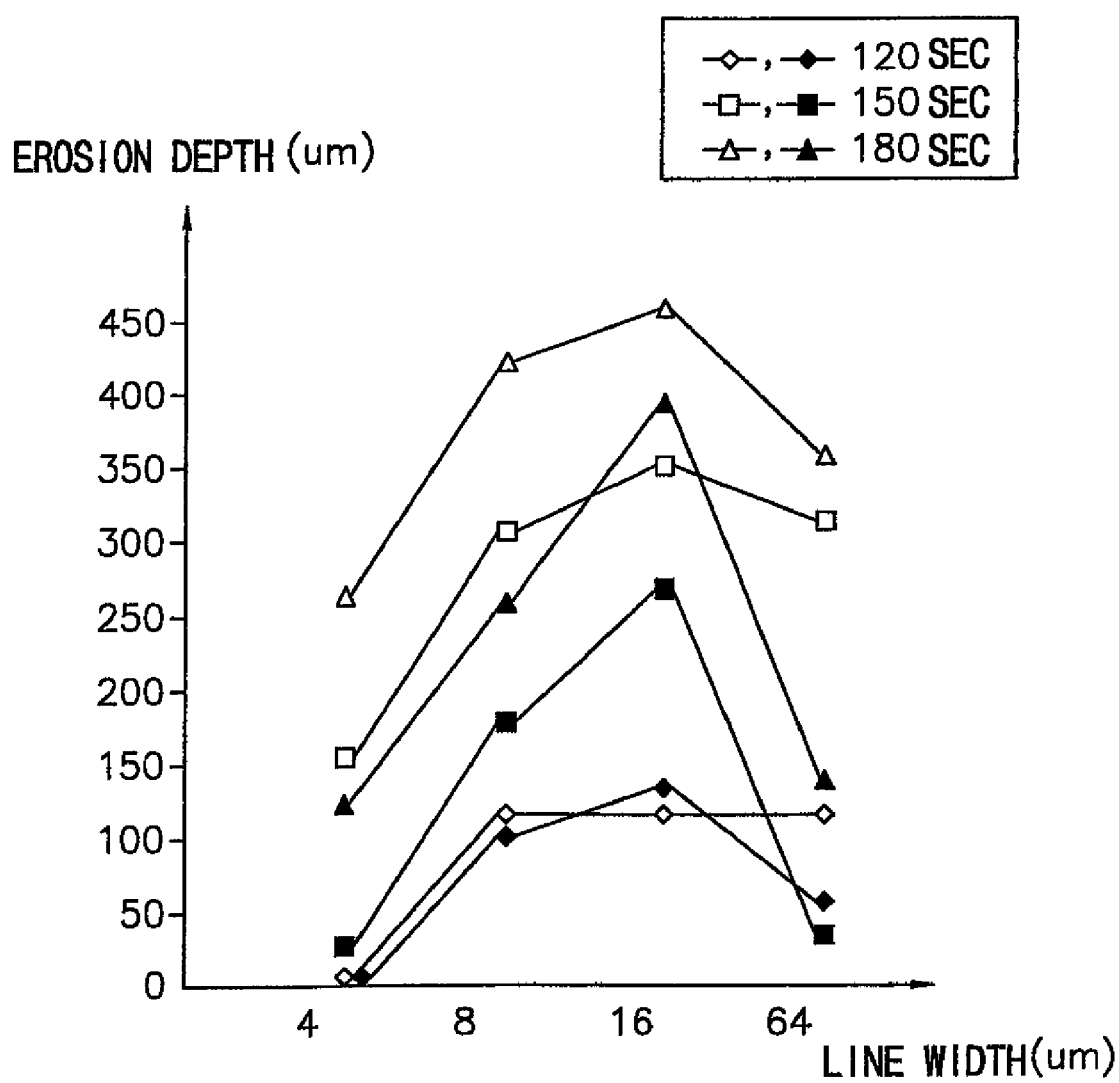
FIG. 12 is a graph showing an erosion depth of a silicon nitride layer according to the kind of an additive composition.

Erosion Depth of a Silicon Nitride Layer According to the Kind of an Additive Composition FIG. 12 is a graph showing an erosion depth of a silicon nitride layer for different additive compositions. A slurry composition having the same components prepared by Example 6 was used, except that poly(acrylic acid) having a weight average molecular weight of about 2,000 (first composition), and a slurry composition prepared by Example 6 were used (second composition) for the measure of the erosion depth when fabricating an STI structure. The designated result exhibits the erosion depth of a silicon nitride layer when fabricating the STI structure by using the first and the second compositions.

The area occupied by the silicon nitride layer is about 20% of the total area of the STI structure. Line width means a distance from a mouth to the neighboring mouth of a trench of the STI structure. The thickness of the silicon nitride layer was about 1,000 Å.

First, polishing was implemented for 120 seconds by using the first composition (◇) and the second composition (◆). Referring to the graph, similar eroding results were obtained for the first and the second compositions when the line width was 4 μm and 8 μm. However, when the line width was 16 μm, a better eroding result was obtained when using the first composition and when the line width was 64 μm, a better eroding result was obtained when using the second composition.

Then, polishing was implemented for 150 seconds by using the first composition (□) and the second composition (■). Referring to the graph, the second composition exhibits a better eroding result than the first composition over the whole range of the line width.

Also, polishing was implemented for 180 seconds by using the first composition (△) and the second composition (▲). Referring to the graph, the second composition exhibits a better eroding result than the first composition over the whole range of the line width.

When considering the above results, it can be noted that the additive composition including both of the first salt of the first polymeric acid having the first weight average molecular weight and the second salt of the second polymeric acid having the second weight average molecular weight which is larger than the first weight average molecular weight, exhibits favorable polishing effects.

Figure 13:
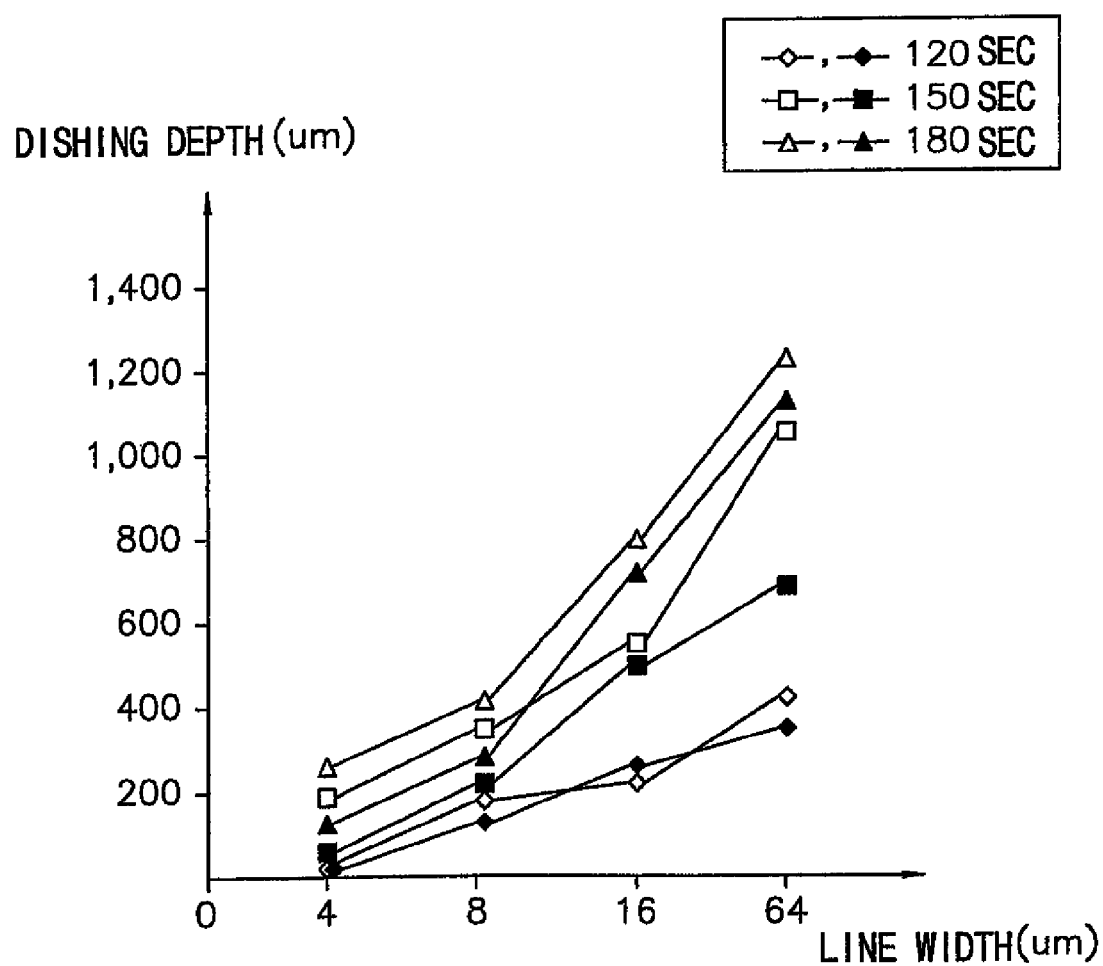
FIG. 13 is a graph showing a dishing depth of a silicon oxide layer according to the kind of an additive composition.

Dishing Depth of a Silicon Oxide Layer According to the Kind of an Additive Composition FIG. 13 is a graph showing a dishing depth of a silicon oxide layer for different additive compositions. The first and the second compositions used for the fabrication of the STI structure and used for obtaining the result illustrated in FIG. 12, were used again. Line width designates a distance from a mouth to the neighboring mouth of a trench of the STI structure.

First, polishing was implemented for 120 seconds by using the first composition (◇) and the second composition (◆). Referring to the graph, the first and the second compositions exhibit similar dishing results over the whole range of the line width.

Then, polishing was implemented for 150 seconds by using the first composition (□) and the second composition (■). Referring to the graph, the second composition exhibits a better dishing result than the first composition over the whole range of the line width.

Also, polishing was implemented for 180 seconds by using the first composition (Δ) and the second composition (▲). Referring to the graph, the second composition exhibits a better dishing result than the first composition over the whole range of the line width.

When considering the above results, it can be noted that the additive composition including both of the first salt of the first polymeric acid having the first weight average molecular weight and the second salt of the second polymeric acid having the second weight average molecular weight which is larger than the first mean molecular weight, exhibits favorable polishing effects.

Figure 14:
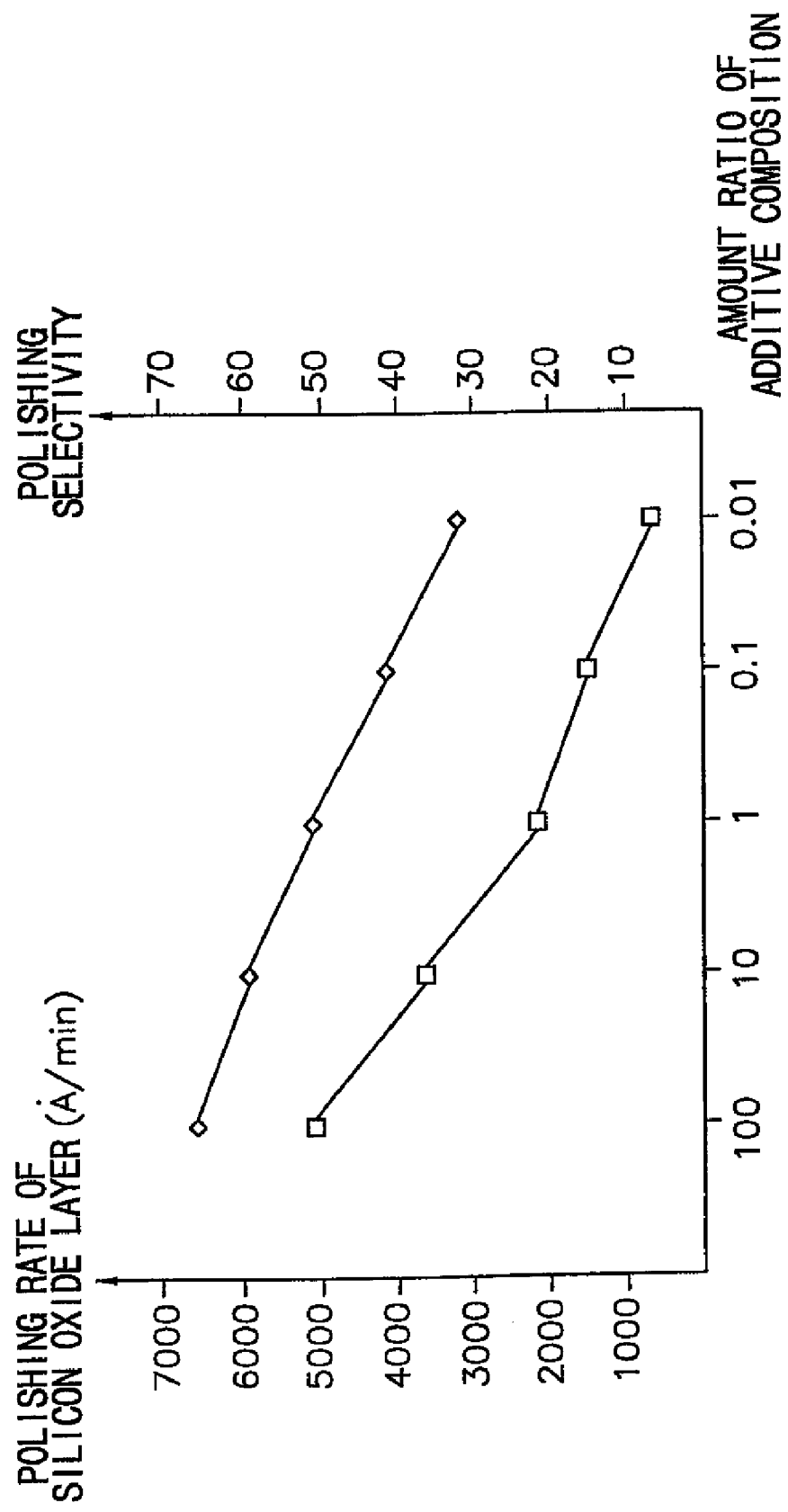
FIG. 14 is a graph illustrating a polishing selectivity and a polishing rate of a silicon oxide layer according to an amount ratio of two components in an additive composition of the present invention.

Polishing Selectivity and Polishing Rate According to the Amount of an Additive Composition FIG. 14 is a graph illustrating a polishing selectivity and a polishing rate of a silicon oxide layer according to an amount ratio of two components in an additive composition of the present invention. The polishing rate is designated by □ and the polishing selectivity is designated by ◇.

Figure 15:
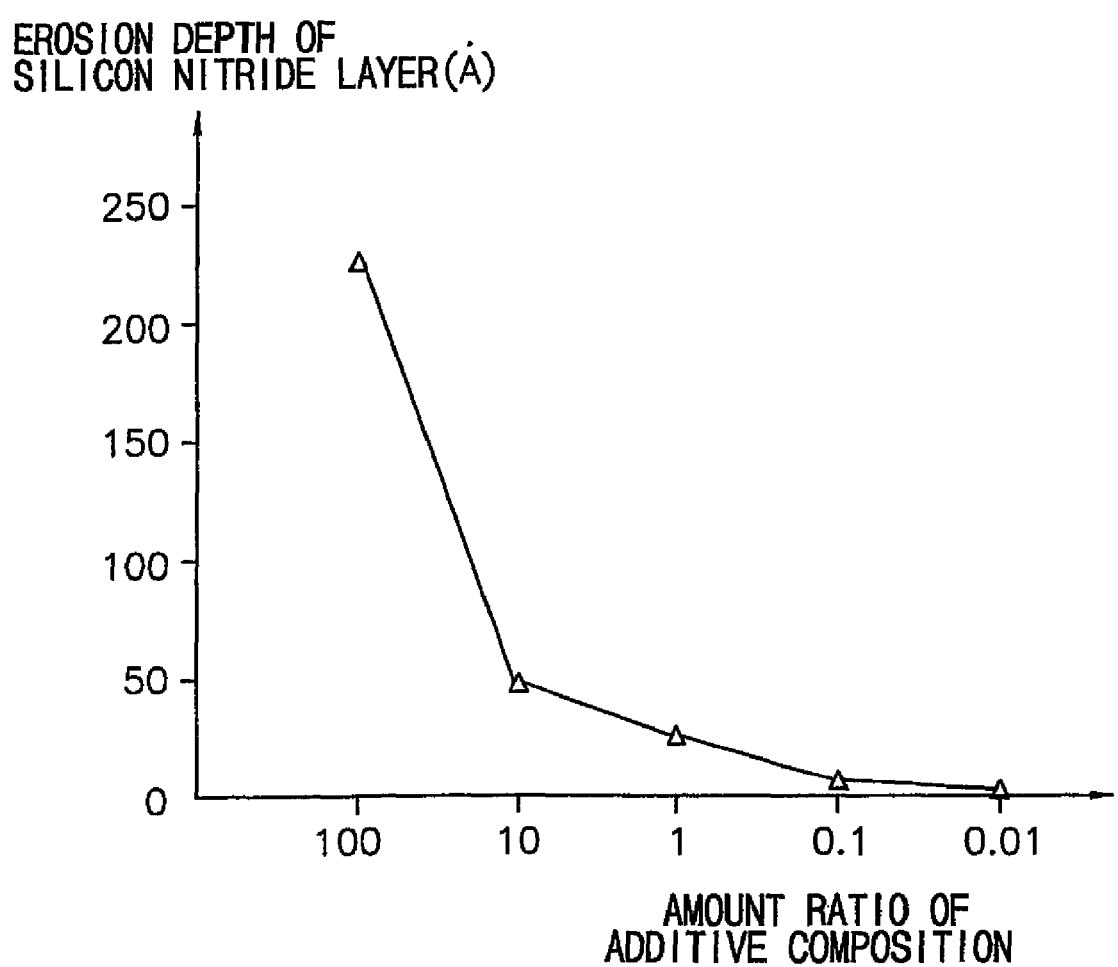
FIG. 15 is a graph showing an erosion depth of a silicon nitride layer according to an amount ratio of two components in an additive composition of the present invention.

FIG. 15 is a graph for showing an erosion depth of a silicon nitride layer according to an amount ratio of two components in an additive composition of the present invention.

The polishing rate and the polishing selectivity of the silicon oxide layer and the erosion depth of the silicon nitride layer are measured when fabricating an STI structure. The STI structure was fabricated by using a slurry composition including the same components prepared by Example 6 except for changing the amounts of poly(acrylic acid) having a weight average molecular weight of about 2,000 (a first material) and poly(acrylic acid) having a weight average molecular weight of about 450,000 (a second material), was used. The amount ratio means the ratio of the first material to the second material. The area occupied by the silicon nitride layer is about 20% of the whole area of the STI structure.

Referring to FIG. 14, the polishing rate and the polishing selectivity of the silicon oxide layer is increased as the amount ratio of the additive composition increases. However, when referring to FIG. 15, the erosion depth of the silicon nitride layer is decreased as the amount ratio of the additive composition increases.

When considering the above results, the preferred amount ratio of the first material and the second material is about 100 or less. When the amount ratio is about 1, the polishing rate of the silicon oxide layer is about 2,000 Å/min. When the polishing rate is about 2,000 Å/min or less, the productivity is deteriorated. Therefore, it is preferred that the amount ratio of the first material to the second material in the additive composition exceeds 1.

More preferably, the amount of the first salt of the first polymeric acid is in a range of from about 50 to about 95% by weight and the amount of the second salt of the second polymeric acid is in a range of from about 5 to about 50% by weight.

Defect Generated after Polishing According to a Slurry Composition

Figure 16:
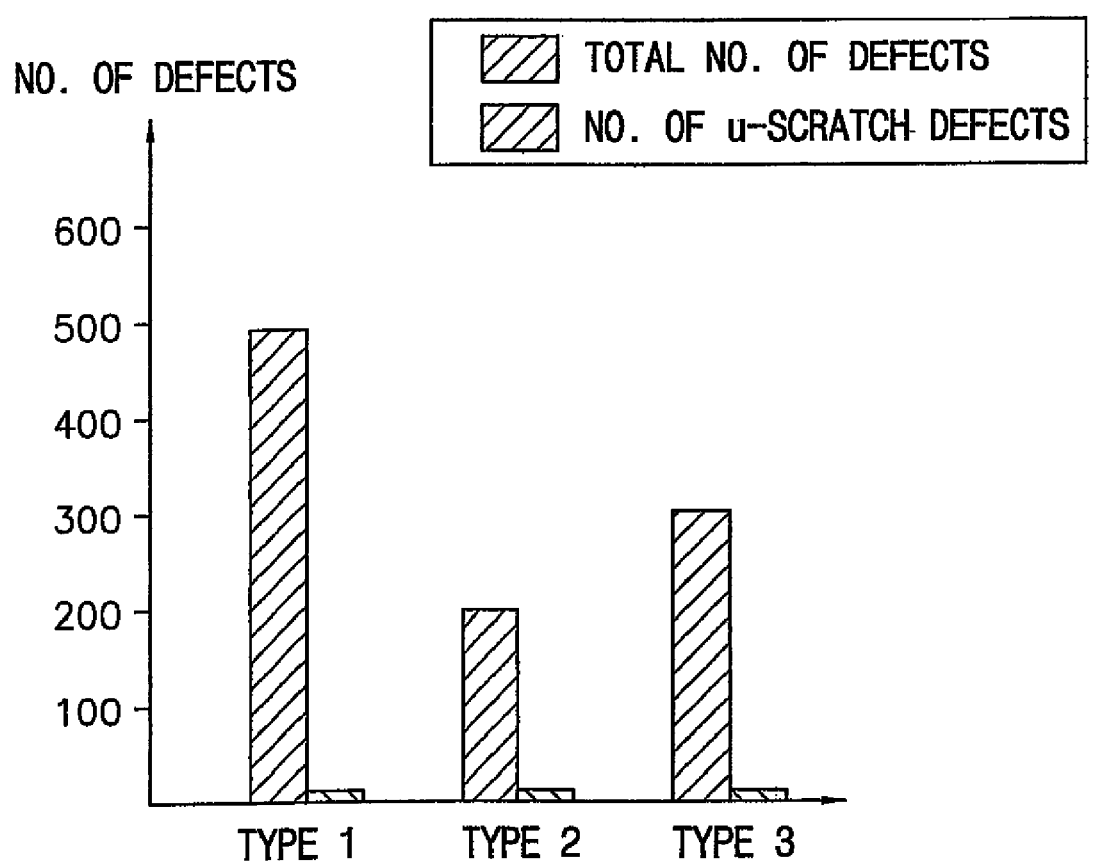
FIG. 16 is a graph showing the number of defects generated after completing polishing using a slurry composition of the present invention.

FIG. 16 is a graph showing the number of defects generated after polishing using a slurry composition of the present invention. The scratch number includes the total number of defects and number of μ-scratch defects mainly generated by the polishing. The number of the scratches was measured by using KLA after completing the polishing and then washing the processed material using diluted HF to 1% for 100 seconds. A slurry composition of type 1 is the same slurry composition prepared by Example 6, except that poly(acrylic acid) having a weight average molecular weight of about 2,000 was used for the preparation of the additive composition. A slurry composition of type 2 is the same slurry composition prepared by Example 6. A slurry composition of type 3 is the same slurry composition prepared by Example 6, except that poly(acrylic acid-co-maleic acid) having a weight average molecular weight having about 2,000 and poly (acrylic acid) having a weight average molecular weight having about 450,000 were used for the preparation of the additive composition.

When considering the results, it can be noted that the type 2 and the type 3 compositions show better results than the type 1 composition.

Accordingly, the additive composition including both of the first salt and the second salt of the polymeric acid is preferably used when considering the defects generated during the polishing.

Figure 17:
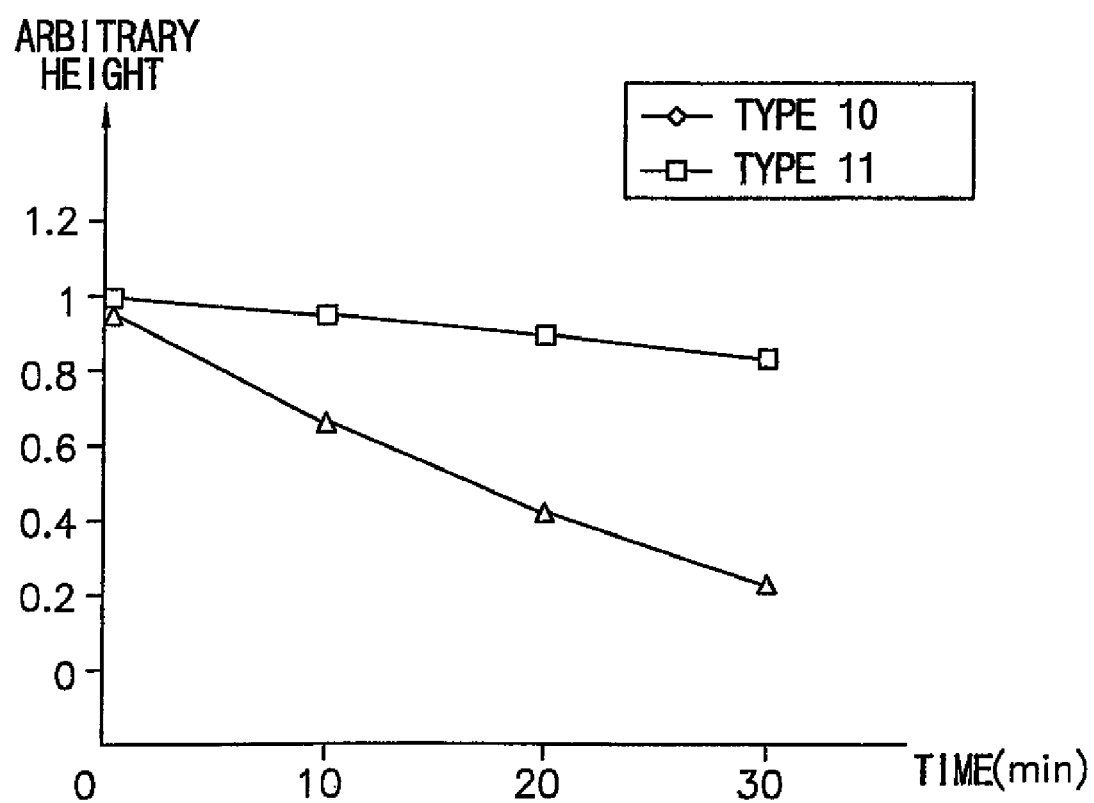
FIG. 17 is a graph for explaining the stability of a slurry composition according to the present invention.

Stability of a Slurry Composition According to the kind of an Additive Composition FIG. 17 is a graph explaining the stability of a slurry composition according to the present invention. The arbitrary height is designated while standing the slurry composition under air. A slurry composition of type 10 (◇) is the same slurry composition prepared by Example 6, except that poly (acrylic acid) having a weight average molecular weight of about 2,000 is used for preparing an additive composition. A slurry composition of type 11 (□) is the same slurry composition prepared by Example 6. The arbitrary height is obtained by dividing the height of a target slurry composition stood for a given time under air by an initial height. The lowering of the arbitrary height is caused by an agglomeration of polishing particles in the slurry composition.

When standing the slurry compositions of type 10 and type 11, the arbitrary height resulted from the type 11 is higher than that from the type 10. Therefore, the slurry composition of type 11 is more stable than the slurry composition of type 10. That is, the generation of the agglomeration of the slurry composition of type 11 is less than that of the slurry composition of type 10.

This shows that the slurry composition including the additive composition containing both of the first salt and the second salt of the polymeric acid is advantageous when considering preparation and storage.

In conclusion, a preferred additive composition includes the first salt of polymeric acid and the second salt of polymeric acid. A preferred slurry composition includes an additive composition containing the first salt of polymeric acid and the second salt of polymeric acid. A preferred polishing method is implemented by using the slurry composition.

A polishing process that exhibits a high polishing selectivity can be realized by using the slurry composition of the present invention. Therefore, the polishing method can be positively applied for the manufacture of a semiconductor device having a minute pattern, such as semiconductor devices which require a design rule of 0.13 µm or less. Device reliability and manufacturing productivity can thus be improved.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of polishing, comprising:
    preparing a slurry composition which includes an additive composition comprising about 50 to about 95% by weight of a first salt of polymeric acid including a first polymeric acid having a first weight average molecular weight and a first base material, and about 5 to about 50% by weight of a second salt of polymeric acid including a second polymeric acid having a second weight average molecular weight and a second base material, wherein the weight percentages are based on a sum of the first and second salts of polymeric acid, and each of the first and second salts of polymeric acid is independently selected from the group consisting of poly(acrylic acid), poly(acrylic acid-co-maleic acid) and poly(methyl vinyl ether-alt-maleic acid);
    providing the slurry composition onto a surface portion of a polishing pad; and
    contacting the surface portion of the polishing pad with a surface of a material to be processed to polish the surface of the material to be processed,
    wherein the slurry composition is prepared such that the first salt of polymeric acid is different from the second salt of polymeric acid, the second weight average molecular weight is from about 10 to about 1,000 times larger than the first weight average molecular weight, and the first base material is the same as or different than the second base material.

2. The method of polishing as claimed in claim 1, wherein a pH of the additive composition is in a range of from about 4.5 to about 8.8, and a pH of the slurry composition is in a range of from about 5.0 to about 8.0.

3. The method of polishing as claimed in claim 1, wherein the slurry composition comprises a polishing particle composition that includes polishing particles comprising at least one selected from the group consisting of silica, cerium oxide, zirconium oxide and alumina.

4. The method of polishing as claimed in claim 1, wherein an amount of the first salt of polymeric acid is in a range of from about 70 to about 90% by weight, and an amount of the second salt of polymeric acid is in a range of from about 10 to about 30% by weight based on the sum of the first and the second salts of polymeric acid.

5. The method of polishing as claimed in claim 1, wherein the first and second base materials are independently at least one compound selected from the group consisting of sodium hydroxide, potassium hydroxide, ammonium hydroxide and a base amine compound.

6. The method of polishing as claimed in claim 5, wherein the base amine compound is at least one selected from the group consisting of tetra-methyl ammonium hydroxide, tetra-ethyl ammonium hydroxide, tetra-propyl ammonium hydroxide and tetra-butyl ammonium hydroxide.

7. The method of polishing as claimed in claim 1, wherein the first weight average molecular weight is in a range of from about 1,000 to about 10,000, and the second weight average molecular weight is in a range of from about 10,000 to about 10,000,000.

8. The method of polishing in claim 1, wherein an amount ratio of the first salt of polymeric acid by weight with respect to the second salt of polymeric acid by weight exceeds 1 and is less than 100.

9. The method of polishing as claimed in claim 1, wherein the material to be processed in a substrate including a first material layer and a second material layer, the first and the second material layers being integrated and being made of different materials.

10. The method of polishing as claimed in claim 9, wherein the first material layer is a silicon nitride layer and the second material layer is a silicon oxide layer.

11. The method of polishing as claimed in claim 1, wherein the material to be processed is a substrate including a first material layer and a second material layer formed on the first material layer.

12. The method of polishing as claimed in claim 11, wherein the first material layer is a silicon nitride layer and the second material layer is a silicon oxide layer.

13. The method of claim 1, wherein the additive composition is in the form of a liquid, and an amount of the sum of the first and second salts of polymeric acid is a range of about 1 to about 30% by weight of the liquid.

14. The method of claim 13, wherein the additive composition further comprises water in an amount of about 70 to about 99% by weight of the liquid.

* * * * *